United States Patent
Oh et al.

(10) Patent No.: US 8,230,147 B2
(45) Date of Patent: *Jul. 24, 2012

(54) APPARATUS AND METHOD FOR COMMUNICATING WITH SEMICONDUCTOR DEVICES OF A SERIAL INTERCONNECTION

(75) Inventors: HakJune Oh, Kanata (CA); Hong Beom Pyeon, Kanata (CA); Jin-Ki Kim, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/784,238

(22) Filed: May 20, 2010

(65) Prior Publication Data

US 2010/0268853 A1 Oct. 21, 2010

Related U.S. Application Data

(63) Continuation of application No. 11/942,173, filed on Nov. 19, 2007, now Pat. No. 7,752,364.

(60) Provisional application No. 60/868,773, filed on Dec. 6, 2006, provisional application No. 60/890,935, filed on Feb. 21, 2007.

(51) Int. Cl.
 *G06F 13/00* (2006.01)
 *G06F 1/12* (2006.01)
 *G06F 12/00* (2006.01)
 *G11C 7/00* (2006.01)

(52) U.S. Cl. ............... 710/110; 326/30; 365/191; 711/5; 711/169; 713/401

(58) Field of Classification Search .................. 710/110; 713/401; 711/169, 5; 326/30; 365/191
See application file for complete search history.

(56) References Cited

U.S. PATENT DOCUMENTS

| | | | |
|---|---|---|---|
| 5,404,460 | A | 4/1995 | Thomsen et al. |
| 5,430,859 | A | 7/1995 | Norman et al. |
| 5,475,854 | A | 12/1995 | Thomsen et al. |
| 5,729,683 | A | 3/1998 | Le et al. |
| 5,768,173 | A | 6/1998 | Seo et al. |
| 5,806,070 | A | 9/1998 | Norman et al. |
| 5,870,445 | A | 2/1999 | Farwell |
| 6,052,331 | A | 4/2000 | Araki et al. |
| 6,144,576 | A | 11/2000 | Leddige et al. |
| 6,148,363 | A | 11/2000 | Lofgren et al. |

(Continued)

OTHER PUBLICATIONS

Stephen L Diamond, "SyncLink: High-speed DRAM for the future", Micro Standards, IEEE Micro, Dec. 1996, pp. 74-75.

(Continued)

*Primary Examiner* — Paul R Myers
*Assistant Examiner* — Christopher A Daley

(57) ABSTRACT

A system controller communicates with devices in a serial interconnection. The system controller sends a read command, a device address identifying a target device in the serial interconnection and a memory location. The target device responds to the read command to read data in the location identified by the memory location. Read data is provided as an output signal that is transmitted from a last device in the serial interconnection to a data receiver of the controller. The data receiver establishes acquisition instants relating to clocks in consideration of a total flow-through latency in the serial interconnection. Where each device has a clock synchronizer, a propagated clock signal through the serial interconnection is used for establishing the acquisition instants. The read data is latched in response to the established acquisition instants in consideration of the flow-through latency, valid data is latched in the data receiver.

17 Claims, 19 Drawing Sheets

U.S. PATENT DOCUMENTS

| | | | |
|---|---|---|---|
| 6,191,663 | B1 | 2/2001 | Hannah |
| 6,282,131 | B1 | 8/2001 | Roy |
| 6,304,921 | B1 | 10/2001 | Rooke |
| 6,317,812 | B1 | 11/2001 | Lofgren et al. |
| 6,385,685 | B1 | 5/2002 | Dell et al. |
| 6,578,157 | B1 * | 6/2003 | Weber et al. ............... 714/6.13 |
| 6,715,044 | B2 | 3/2004 | Lofgren et al. |
| 6,779,046 | B1 | 8/2004 | Osuga |
| 6,839,786 | B2 | 1/2005 | Kim et al. |
| 6,928,501 | B2 | 8/2005 | Andreas et al. |
| 6,944,697 | B2 | 9/2005 | Andreas |
| 6,950,325 | B1 | 9/2005 | Chen |
| 7,031,221 | B2 | 4/2006 | Mooney et al. |
| 7,032,039 | B2 | 4/2006 | DeCaro |
| 7,089,412 | B2 | 8/2006 | Chen |
| 7,168,027 | B2 | 1/2007 | Lee et al. |
| 7,478,193 | B2 | 1/2009 | Becca et al. |
| 7,577,760 | B2 | 8/2009 | Lee |
| 7,752,364 | B2 * | 7/2010 | Oh et al. .................. 710/110 |
| 8,010,710 | B2 * | 8/2011 | Sumi ........................ 710/8 |
| 2007/0076479 | A1 | 4/2007 | Kim et al. |
| 2007/0076502 | A1 | 4/2007 | Pyeon et al. |
| 2007/0096774 | A1 | 5/2007 | Yang et al. |
| 2007/0109833 | A1 | 5/2007 | Pyeon et al. |
| 2007/0233903 | A1 | 10/2007 | Pyeon |
| 2007/0234071 | A1 | 10/2007 | Pyeon |
| 2008/0140899 | A1 | 6/2008 | Oh et al. |
| 2008/0140916 | A1 | 6/2008 | Oh et al. |
| 2008/0168296 | A1 | 7/2008 | Oh et al. |
| 2008/0226004 | A1 | 9/2008 | Oh |
| 2009/0129184 | A1 | 5/2009 | Schuetz |

OTHER PUBLICATIONS

Stein Gjessing et al., "A RAM link for high speed", IEEE Spectrum, Oct. 1992, pp. 52-53.

Stein Gjessing et al., "RamLink: A High-Bandwidth Point-to-Point Memory Architecture", Copyright 1992 IEEE, pp. 328-331.

Stein Gjessing et al., "Performance of the RamLink Memory Architcture", Copyright 1994 IEEE, pp. 154-162.

John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.

Yoichi Oshima et al., "High-Speed Memory Architectures for Multimedia Applications", IEEE, Circuits & Devices, Jan. 1997, pp. 8-13.

Joseph Kennedy et al., "A 2Gb/s Point-to-Point Heterogeneous Voltage Capable DRAM Interface for Capacity-Scalable Memory Subsystems", IEEE ISSCC 2004/Session 11/DRAM/11.8, 10 pages.

Jae-Kwan Kim et al., "A 3.6Gb/s/pin Simultaneous Bidirectional (SBD) I/O Interface for High-Speed DRAM", IEEE ISSCC 2004 / Session 22 / DSL and Multi-Gb/s I/O 22.7, 8 pages.

Craig L. King et al., "Communicating with Daisy Chained MCP42XXX Digital Potentiometers", Microchip AN747, 2001 Microchip Technology Inc., 8 pages.

"1024K I2CTM CMOS Serial EEPROM", Microchip 24AA1025/ 24LC1025/ 24FC1025, 2006 Microchip Technology Inc., 22 pages.

"How to Use OTP Registers for Security Applications", Application Note 717, Oct. 1999, Intel Corporation, 10 pages.

Intel, "Clocking—Lecture 2 and 3, Purpose—Clocking Design Topics", http://download.intel.com/education/highered/signal/ ELCT865/Class2_3_4_Clocking.ppt, Dec. 4, 2002, 42 pages.

Atmel—"8-megabit 2.5-volt Only or 2.7-volt Only DataFlash"— AT5DB081B, Rev. 2225H-DFLSH-10/04, Atmel Corporation 2004, 33 pages.

ST—M25P20—"2Mbit, Low Voltage, Serial Flash Memory With 40MHz SPI Bus Interface", Aug. 2005, STMicroelectronics, 40 pages.

SST—"16 Mbit SPI Serial Flash"—SST25VF016B, Preliminary Specifications, 2005 Silicon Storage Technology, Inc., 28 pages.

"The I2C-Bus Specification", Version 2.1, Jan. 2000, Philips Semiconductors, 46 pages.

FBDIMM—"DDR2 Fully Buffered DIMM" 240pin FBDIMMs based on 512Mb C-die (RoHS complaint)—DDR2 SDRAM, Rev. 1.3—Sep. 2006, Samsung Electronics, 32 pages.

K9K8G08U1M—K9F4G08U0M—"K9XXG08UXM"—Preliminary Flash Memory, Samsung Electronics, 43 pages.

S70GL0IGN00 MirrorBit Flash, Publication No. S70GL0IGN00_ 00, Revision A, Amendment I, Issue Date Jun. 1, 2005, Spansion LLC, 83 pages.

"IEEE Standard for High-Bandwidth Memory Interface Based on Scalable Coherent Interface (SCI) Signaling Technology (RamLink)", IEEE Standards Board Mar. 19, 1996, 98 pages.

"Intel StrataFlash Wireless Memory (L18)"—28F640L18, 28F128L18, 28F256L18, Order No. 251902, Revision: 010, Aug. 2005, 106 pages.

"A Practical Guide to Serial Storage Architecture for AIX", IBM Corporation, International Technical Support Organization, First Edition (Jul. 1996), 196 pages.

"HyperTransport I/O Link Specification", Revision 3.00, Document #HTC20051222-0046-0008, 2001-2006 HyperTransport Technology Consortium, Apr. 21, 2006, 428 pages.

"HyperTransport I/O Link Specification", Revision 3.00a, Document #HTC20051222-0046-0017, 2001-2006 HyperTransport Technology Consortium, Nov. 22, 2006, 443 pages.

International Search Report mailed on Feb. 26, 2008 in connection with International Patent Application No. PCT/CA2007/002092, 3 pages.

Written Opinion of the International Searching Authority mailed on Feb. 26, 2008 in connection with International Patent Application No. PCT/CA2007/002092, 4 pages.

International Search Report mailed on May 20, 2008 in connection with International Patent Application No. PCT/CA2008/000237, 4 pages.

Written Opinion of the International Searching Authority mailed on May 20, 2008 in connection with International Patent Application No. PCT/CA2008/000237, 6 pages.

Office Action mailed on Aug. 26, 2009 in connection with U.S. Appl. No. 11/942,173, 9 pages.

* cited by examiner

APPARATUS AND METHOD FOR COMMUNICATING WITH SEMICONDUCTOR DEVICES OF A SERIAL INTERCONNECTION

CROSS-REFERENCE TO RELATED APPLICATIONS

The present application is a CONTINUATION of U.S. patent application Ser. No. 11/942,173, filed on Nov. 19, 2007, hereby incorporated by reference herein. Benefit is claimed under 35 USC §120, by virtue of which benefit is also claimed under 35 USC §119(e) of U.S. Provisional Patent Application Ser. No. 60/868,773, filed Dec. 6, 2006, and U.S. Provisional Patent Application Ser. No. 60/890,935, filed Feb. 12, 2007, both of which are hereby incorporated by reference herein.

FIELD OF THE INVENTION

The present invention relates generally to a system including semiconductor devices and particularly to apparatus and method for communicating with a serial interconnection of a plurality of semiconductor devices.

BACKGROUND

Computer-based systems typically contain semiconductor devices, such as memory devices. The semiconductor devices are controlled by a controller, which may form part of the central processing unit (CPU) of the computer or may be separate therefrom. The controller has a data receiving apparatus as well as an interface for communicating information with the semiconductor devices. Known interfaces include parallel interfaces and serial interfaces.

Parallel interfaces use a large number of pins to read and write information. As the number of pins and wires increases, so do a number of undesired effects, including inter-symbol interference, signal skew and cross talk. These effects are exacerbated at high operating frequencies. When semiconductor devices are connected to one another via their interfaces in a point-to-point fashion, a serial interconnection of semiconductor devices may be formed.

SUMMARY OF THE INVENTION

According to a first broad aspect, the present invention provides a method for communicating with a serial interconnection including a plurality of series-connected semiconductor devices, the serial interconnection including a first device and a last device. The method comprises: supplying a clock signal for operation of the devices in the serial interconnection; sending first instruction information for identifying a target device in the serial interconnection; sending second instruction information for identifying operation of an identified target device to perform, the target device operating in accordance with the second instruction information to provide response data, the response data appearing in an output signal from the last device of the serial interconnection; providing an acquisition instant in relation to the clock signal; and receiving the output signal from the last device to capture the response data in response to the acquisition instant.

For example, in the method, the target device is identified by the first instruction information and is enabled. The enabled target device provides the response data that is to be contained in the output signal.

Advantageously, third instruction information may be sent. For example, the first instruction information is a device address, the second instruction information is an access command, and the third instruction information is a memory location. Advantageously, upon completion of the device address recognition, an identified device as a target device is enabled to read data in an identified location in the memory, so that read data is provided.

For example, an enable signal is sent to the serial interconnection to trigger release of the read data to a succeeding device and thus, the read data is propagated through the succeeding devices in the serial interconnection and provided from the last device in the serial interconnection.

Advantageously, in response to the clock signal, an acquisition instant is established. In response to the established acquisition instant, the read data from the last device in the serial interconnection is latched. For example, the establishing of the acquisition instant is performed in consideration of the flow-through latency of the serial interconnection. Thus, valid data is latched.

According to a second broad aspect, the present invention provides an apparatus for communicating with a serial interconnection including a plurality of series-connected semiconductor devices, the serial interconnection including a first device and a last device. The apparatus comprises: a controller for providing a clock signal for operation of the devices in the serial interconnection and for sending first and second instruction information to the serial interconnection, the first instruction information identifying a target device in the serial interconnection, the second information identifying operation of the target device to perform, the target device operating in accordance with the second instruction information to provide response data, the response data appearing in an output signal from the last device; and a receiver for receiving the output signal from the last device. The receiver includes: acquisition establishing circuitry for establishing an acquisition instant relating to the clock signal; and signal latching circuitry for latching the output signal at the acquisition instant to capture the response data.

According to a third broad aspect, the present invention provides an apparatus for use in processing signals received from a serial interconnection including a plurality of series-connected semiconductor devices, the serial interconnection including a fast device and a last device, wherein a given device in the serial interconnection is responsive to receipt of a command destined therefor to provide response data that appears in an output signal provided from the last device. The apparatus comprises: circuitry for establishing an acquisition instant in response to the command; and circuitry for latching the output signal at the acquisition instant to capture of the response data.

According to a fourth broad aspect, the present invention provides a method for use in processing signals received from a serial interconnection including a plurality of series-connected semiconductor devices, the serial interconnection including a first device and a last device, wherein a given device in the serial interconnection is responsive to receipt of a command destined therefor to provide response data that appears in an output signal provided from the last device. The method comprises: establishing an acquisition instant in response to the command; and latching the output signal in response to the acquisition instant to capture of the response data.

According to a fifth broad aspect, the present invention provides a system comprising: a serial interconnection including a plurality of series-connected semiconductor devices having a first device and a last device, each of the devices being responsive to receipt of a command destined therefor to provide response data that appears in an output signal provided from the last device; a controller configured to effect issuance of a command to the serial interconnection, the command being destined for a target device in the serial interconnection, the target device providing response data that appears in an output signal provided from the last device; and a receiver configured to establish an acquisition instant in response to the command and to latch the output signal in response to the acquisition instant to capture of the response data.

Advantageously, in the system, each of the devices includes a memory and the controller is capable of sending third instruction information to the serial interconnection, the third instruction information identifying a memory location in the memory. The target device reads data from a memory location in the memory identified by the third instruction information and provides the read data as the response data.

In accordance with an embodiment of the present invention, there is provided a system including a master device that communicates with a plurality of salve devices in a serial interconnection. Each of the devices has a slave controller and a memory. The master device includes an instruction transmitter and a data receiver. The instruction transmitter sends a read command, a device address identifying a target device in the serial interconnection and a memory location. An identified target device responds to the read command to read data in the location of the memory identified by the memory location. Read data is provided as an output signal that is transmitted from a last device in the serial interconnection to the data receiver of the master device. The data receiver establishes acquisition instants relating to clocks in consideration of a total flow-through latency in the serial interconnection. In the case where each of the devices has a clock synchronizer, a propagated clock signal through the devices of the serial interconnection is used for establishing the acquisition instants. The acquisition instants are established in consideration of the flow-through latency, valid read data is latched in the data receiver.

In accordance with an embodiment of the present invention, there is provided a system comprising: a serial interconnection wherein a plurality of semiconductor devices is series-connected. The semiconductor devices may be memory devices of one type or more of non-volatile and volatile memories, for example, NAND Flash EEPROM, NOR Flash EEPROM, AND Flash EEPROM, DiNOR Flash EEPROM, Serial Flash EEPROM, DRAM, SRAM, ROM, EPROM, FRAM, MRAM and PCM.

These and other aspects and features of the present invention will now become apparent to those of ordinary skill in the art upon review of the following description of specific embodiments of the invention in conjunction with the accompanying drawings.

BRIEF DESCRIPTION OF THE DRAWINGS

Embodiments of the present invention will now be described, by way of example only, with reference to the attached figures, wherein.

DETAILED DESCRIPTION

Figure 1A:
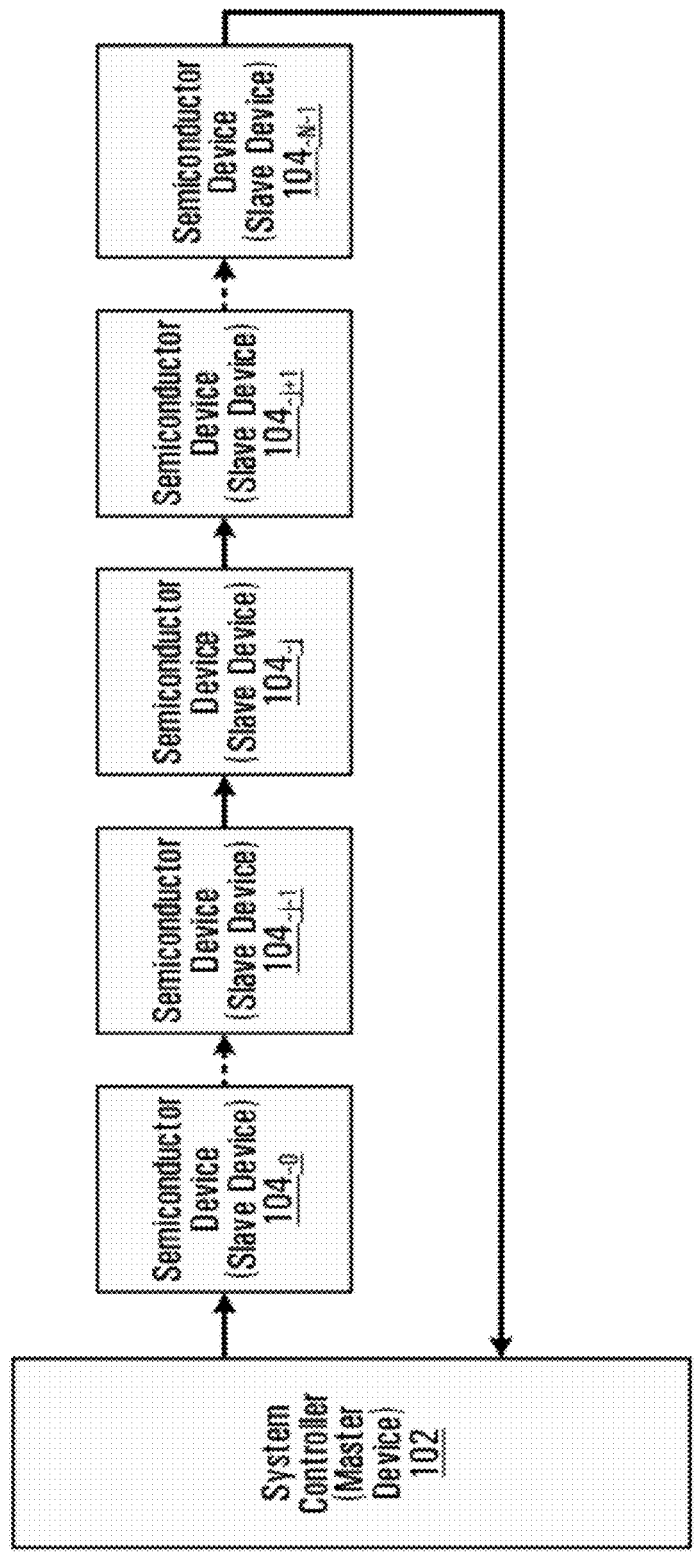
FIG. 1A is a block diagram showing a system according to an embodiment of the present invention, the system including a serial interconnection of a plurality of devices in communication with a controller.

In the following detailed description of embodiments of the present invention, reference is made to the accompanying drawings which form a part hereof, and in which is shown by way of illustration of embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Generally, the present invention relates to a system including semiconductor devices and to apparatus and method for communicating with the devices. A plurality of semiconductor devices is connected in series to be configured in a serial interconnection. For example, two neighboring devices in the serial interconnection are interconnected by serial output of one device and serial input of the other device.

Examples of semiconductor devices contemplated herein include devices which perform actions in response to signals received at one or more input ports and wherein input data is captured at "acquisition instants" that depend on the behavior of a clock signal. For example, the semiconductor devices are semiconductor integrated circuit (IC) devices such as memory devices (including volatile and/or non-volatile memory devices), central processing units, graphics processing units, display controller ICs, disk drive ICs, solid state drives. As far as memory devices are concerned, these may be of a type such as NAND Flash EEPROM, NOR Flash EEPROM, AND Flash EEPROM, DiNOR Flash EEPROM, Serial Flash EEPROM, dynamic random access memory (DRAM), static random access memory (SRAM), ROM, EPROM, FRAM, magnetoresistive random access memory (MRAM) and Phase Change Memory (PCM) (or Phase Change RAM (PCRAM)), to name a few non-limiting possibilities.

Examples of a serial interconnection of semiconductor devices that are series-connected are provided in the following U.S. patent applications, the contents of which are entirely incorporated herein by reference:

Ser. No. 60/722,368, filed Sep. 30, 2005;
Ser. No. 11/324,023, filed Dec. 30, 2005;
Ser. No. 11/496,278, filed Jul. 31, 2006;
Ser. No. 11/521,734, filed Sep. 15, 2006;
Ser. No. 11/606,407, filed Nov. 29, 2006.
Ser. No. 11/771,023 filed Jun. 29, 2007; and
Ser. No. 11/771,241 filed Jun. 29, 2007.

In a serial interconnection of semiconductor devices, one of the devices (e.g., a "target" device) responds to a given instruction and provides response data that is expected to be received by a data receiver connected to a last device in the serial interconnection. Each of the devices has an input-to-output latency and it causes the response data to undergo a delay before being received by the data receiver. This delay is based on a function of various factors, including, among others, the number of devices remaining in the serial interconnection after the target device, the type of devices, and their operating properties (e.g., temperature). As a result, in some implementations, the delay may be unknown and even time-varying.

Without knowledge of the delay undergone by response data through the serial interconnection, it may become impossible for the data receiver to distinguish whether the signal ultimately received from the last device in the serial interconnection contains valid data sent by the target device or invalid data. Data errors, such as resulting from an incorrect data read operation from memory, may therefore occur. The incidence of such errors rises, as the number of series-connected devices becomes greater and their operating frequency becomes higher.

Embodiments of the present invention including a plurality of semiconductor devices will now be described, each of the devices having a memory to which a data access can be performed.

FIG. 1A shows a system according to an embodiment of the present invention, the system including a system controller and a serial interconnection of a plurality of devices in communication with the system controller. In the illustrated example, a system controller 102 communicates with a serial interconnection of N devices that are series-connected. The serial interconnection includes a "first" semiconductor device 104-0, - - - , a j$-1^{th}$ semiconductor device 104-$j$-1, a $j^{th}$ semiconductor device 104-$j$, a j+$1^{th}$ semiconductor device 104-$j$+1, - - - and a "last" ($N^{th}$) semiconductor device 104-N-1, N being an integer, where $0 \leq j \leq N-1$. The semiconductor devices 104-0 - - - N-1 can be semiconductor devices, for example, such as memory devices. In the case where the semiconductor devices 104-0 - - - N-1 are memory devices, the system controller 102 is implemented as a memory controller. It should be understood that the system controller 102 can itself be a semiconductor device.

In the system shown in FIG. 1A, during an initialization procedure, the devices of the serial interconnection are assigned by device addresses or device identifiers by the system controller 102. For example, devices addresses of consecutive numbers from low to high are generated and assigned to the devices 104-0 - - - 104-N-1. Each of the devices 104-0 - - - 104-N-1 has its own address register (not shown) and the address register holds the assigned device address. After the device addresses are assigned to the devices 104-0 - - - 104-N-1, the system controller 102 sends an access command and other information to control operations of the devices of the serial interconnection to the first device 104-0 thereof, the operation including, for example, device address recognition and data processing. One of the data processing is to access a memory (not shown) included in each of the devices. For example, in the case of an access command being a write command, provided data is written into the memory of the target (or destined) device in accordance with the device address. In the case of an access command being a read command, the data of the memory is read in accordance with the memory address and the read data is transmitted to another device and forwarded to the system controller 102. Examples of the device address assignment, the device address recognition and the data accessing are provided in U.S. Provisional Patent Application No. 60/787,710, filed Mar. 28, 2006; U.S. Provisional Patent Application No. 60/802,645, filed May 23, 2006; and U.S. Provisional Patent Application No. 60/868,773 filed Dec. 6, 2006, the contents of which are entirely incorporated herein by reference.

In the system of FIG. 1A, the system controller 102 is hereinafter referred to as a "master device", while the devices 104-0 - - - N-1 are hereinafter referred to as "slave devices". In the particular example, the devices 104-0 - - - N-1 have the same configuration. The operations of the serially interconnected devices are synchronized with clocks (not shown) provided thereto by the master device 102. For example, the clocks provided by either a common clock fashion or a clock transfer fashion, as described later.

Figure 1B:
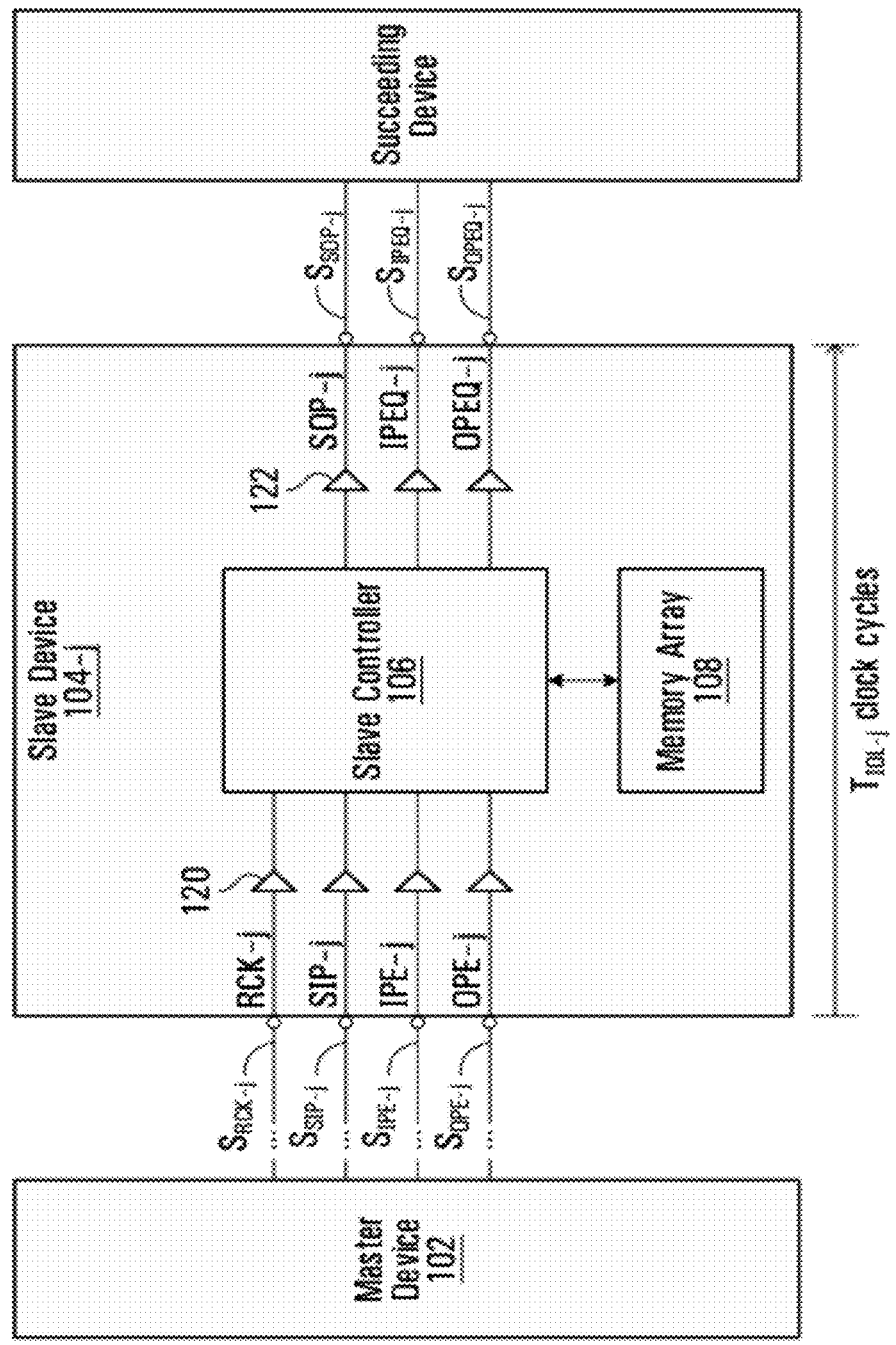
FIG. 1B is a block diagram showing details of one example of one of the devices of FIG. 1A.

FIG. 1B shows details of one of the devices of FIG. 1A. Referring to FIGS. 1A and 1B, the master device 102 is in communication with the slave device 104-$j$, which is also in communication with a succeeding device. Where j<N-1, the succeeding device is next slave device 104-$j$+1. Where j=N-1, the succeeding device is the master device 102. Where j=0, the slave device is the first device 104-0 and the master device 102 directly communicate with the first device 104-0. Where j≠0, the master device 102 communicates indirectly with the slave device.

The present device 104-$j$ includes a slave controller 106, a memory array 108, and an interface comprising a plurality of input ports and output ports. The slave controller 106 is responsive to signals received from the master device 102 via the input ports of the interface of slave device 104-$j$. In the illustrated example, the slave controller 106 performs various control and processing functions with access to the memory array 108 in response to signals arriving via the input ports, and provides signals to the succeeding device via the output ports of the slave device 104-$j$. As mentioned above, the succeeding device can be another slave device or the master device 102, for example, depending on the relative position of slave device 104-$j$ within the serial interconnection.

To be more specific, the interface of slave device 104-$j$ includes a serial input port (hereinafter, the "SIP-j port") and a serial output port (hereinafter, the "SOP-j port"). The SIP-j port is used to transfer information (e.g., address, command and data information), among others, carried by an input information signal $S_{SIP-j}$ into slave device 104-$j$, some of this information being destined for the slave controller 106 and some being destined for the memory array 108. The SOP-j port provides an output information signal $S_{SOP-j}$ that carries information (e.g., address, command and data information) out of slave device 104-$j$, with some of this information possibly having originated from the memory array 108.

In addition, the interface of slave device 104-$j$ includes an input port enable input port (hereinafter, the "IPE-j port") and an input port enable echo output port (hereinafter, the "IPEQ-j port"). The IPE-j port receives an input port enable signal $S_{IPE-j}$. The input port enable signal $S_{IPE-j}$ is used by slave device 104-$j$ to enable the SIP-j port such that when the input port enable signal $S_{IPE-j}$ is activated, this allows the serial input of data to slave device 104-$j$ via the SIP-j port for processing by the slave controller 106. The input port enable signal $S_{IPE-j}$ is also propagated through the slave controller 106 to the IPEQ-j port of slave device 104-$j$ from which an echo signal $S_{IPEQ-j}$ is provided to the succeeding device.

In addition, the interface of slave device 104-$j$ includes an output port enable input port (hereinafter, the "OPE-j port") and an output port enable echo output port (hereinafter, the "OPEQ-j port"). The OPE-j port receives an output port enable signal $S_{OPE-j}$. The output port enable signal $S_{OPE-j}$ is used by slave device 104-$j$ to enable the SOP-j port such that when the output port enable signal $S_{OPE-j}$ is activated, this allows the serial output of data expected to be sent out by slave device 104-$j$ via the SOP-j port. The output port enable signal $S_{OPE-j}$ is also propagated through the slave controller 106 to the OPEQ-j port of slave device 104-$j$ from which an echo signal $S_{OPEQ-j}$ is provided to the succeeding device.

In addition, the interface of slave device 104-$j$ includes a clock input port (hereinafter, the "RCK-j port"). The RCK-j port receives an input clock signal $S_{RCK-j}$ from the master device 102, which is used to control latching of the signals present at the SIP-j port into registers (not shown) internal to slave device 104-$j$, as well as latching of signals onto the SOP-j port from registers internal to slave device 104-$j$. The input clock signal $S_{RCK-j}$ is also used to control latching of the signals present at the IPE-j and OPE-j ports into registers internal to slave device 104-$j$ and subsequently onto the IPEQ-j and OPEQ-j ports, respectively.

In addition, the interface of slave device 104-$j$ includes a chip select port (not shown), which receives a chip select signal from the master device 102 that enables operation of slave device 104-$j$ and possibly other slave devices concurrently. A reset port (not shown) may also be provided, for the purposes of carrying a reset signal from the master device 102 for resetting one or more functions of the slave device 104-$j$.

Those skilled in the art will also appreciate that other components may be provided in slave device 104-$j$ without departing from the scope of the invention, such as buffers, phase shifters, other logic sub-circuits, etc., depending on the clock rate type (e.g., single data rate versus double data rate), the clock response type (e.g., edge-aligned versus center-aligned) and various other aspects of the functionality of slave device 104-$j$. For example, in the illustrated embodiment, slave device 104-$j$ includes a plurality of input buffers 120 connected to the RCK-j, SIP-j, OPE-j and IPE-j ports and a plurality of output buffers 122 connected to the SOP-j, OPEQ-j and IPEQ-j ports.

As mentioned above, the echo signals $S_{IPEQ-j}$ and $S_{OPEQ-j}$ are propagated versions of the input port enable signal $S_{IPE-j}$ and the output port enable signal $S_{OPE-j}$, respectively, and, as such, will have undergone a delay, referred to herein as an input-to-output latency (or "flow-through" latency) and denoted $T_{IOL-j}$. $T_{IOL-j}$, which in this embodiment can be expressed in terms of a number of clock cycles, characterizes the design of slave device 104-$j$ and, more particularly, the slave controller 106. $T_{IOL-j}$ may be different for devices of different types and specifications. In an embodiment, $T_{IOL-j}$ is designed to be as low as possible for a nominal clock rate, while guaranteeing that the slave controller 106 has sufficient time to process information and data carried by the input information signal $S_{SIP-j}$ at the SIP-j port and complete any requisite interactions with the memory array 108.

Upon activation of the input port enable signal $S_{IPE-j}$, the data carried by the input information signal $S_{SIP-j}$ is processed by slave device 104-$j$ after a delay of $T_{IOL-j}$ clock cycles. Thus, one can view the state of the input port enable signal $S_{IPE-j}$ as establishing a time window during which the input information signal $S_{SIP-j}$ carries data to be processed by slave device 104-$j$. Meanwhile, the current states of the input port enable signal $S_{IPE-j}$, the output port enable signal $S_{OPE-j}$ and the input information signal $S_{SIP-j}$ are transferred out onto the echo signal $S_{IPEQ-j}$, the echo signal $S_{OPEQ-j}$ and the output information signal $S_{SOP-j}$, respectively, so that they appear thereon after the aforesaid delay of $T_{IOL-j}$ clock cycles. Any relationship in terms of synchronization that may have existed among the input information signal $S_{SIP-j}$, the input port enable signal $S_{IPE-j}$ and the output port enable signal $S_{OPE-j}$ is, therefore, maintained for the benefit of the succeeding device.

The impact of activation of the output port enable signal $S_{OPE-j}$ is slightly different. On the one hand, slave device 104-$j$ may expect to send out data based on a previously received instruction (e.g., a "read" command as will be described below). Here, activation of the output port enable signal $S_{OPE-j}$ causes such data to begin to appear in the output information signal $S_{SOP-j}$ after a delay of $T_{IOL-j}$ clock cycles. Meanwhile, the current states of the input port enable signal $S_{IPE-j}$ and the output port enable signal $S_{OPE-j}$ are transferred out onto the echo signals $S_{IPEQ-j}$ and $S_{OPEQ-j}$, respectively, so that they appear thereon after the aforesaid delay of $T_{IOL-j}$ clock cycles. Thus, where slave device 104-$j$ expects to send out information, one can view the state of the echo signal $S_{OPEQ-j}$ as establishing a time window during which the output information signal $S_{SOP-j}$ validly carries data output by slave device 104-$j$.

On the other hand, where slave device 104-$j$ does not expect to send out information based on a previously received instruction (or in the absence of such instruction altogether), activation of the output port enable signal $S_{OPE-j}$ is meaningless for slave device 104-$j$. In such cases, the current states of the input port enable signal $S_{IPE-j}$, the output port enable signal $S_{OPE-j}$ and the input information signal $S_{SIP-j}$ are simply transferred out onto the echo signal $S_{IPEQ-j}$, the echo signal $S_{OPEQ-j}$ and the output information signal $S_{SOP-j}$, respectively, so that they appear thereon after the aforesaid delay of $T_{IOL-j}$ clock cycles. Any relationship in terms of synchronization that may have existed among the input information signal $S_{SIP-j}$, the input port enable signal $S_{IPE-j}$ and the output port enable signal $S_{OPE-j}$ is, therefore, maintained for the benefit of the succeeding device.

Some of the data carried by the input information signal $S_{SIP-j}$ during the above-mentioned time window, i.e., while the input port enable signal $S_{IPE-j}$ remains activated, may digitally encode a command from the master device 102. Such commands are interpreted by the slave controller 106 and translated into control signals fed to various elements of the memory array 108 and other circuitry (not shown) of slave device 104-*j*. Examples of a command include a "write" command and a read command, among other possibilities. In an embodiment of the present invention, commands are in the form of packets which form a higher layer protocol of communication between the master device 102 and slave device 104-*j*.

In a data access procedure, the master device 102 provides an instruction to the serial interconnection. Thus, the master device 102 sends a master serial output information signal $S_{SOP}$ to the first device in the serial interconnection. The master serial output information signal $S_{SOP}$ contains instruction information to perform the device address recognition and data processing (e.g., read, write). For example, the instruction information is contained in a command string that has an encoded format as shown in Table I. In this particular example, the command string includes first, second and third information of an instruction. Other formats are possible, including a variety of other encoding schemes, arrangements of bits, etc.

TABLE I

| 1st Byte | 2nd Byte | 3rd Byte |
|---|---|---|
| "device address" | B1h | "read location" |

In Table I, the first byte of the command string (the first information of the instruction) represents a hexadecimal or other value that is information identifying a device address of slave device 104-*j* or of another device (i.e., the device address of a target device). Slave device 104-*j* becomes aware of its device address (if "targeted") during an address recognition procedure, based on the device address contained in the first byte of the received command string. If the slave controller 106 of that device recognizes the address of slave device 104-*j* in the first byte of the command string, the slave controller 106 will enter a state where it becomes attentive to receipt of a further part of the command string requiring processing. Meanwhile, the slave controller 106 serially transfers the first byte of the command string out onto the SOP-j port thereof after $T_{IOL-j}$ clock cycles. This is done regardless of whether the command is, or is not, destined for slave device 104-*j*.

In Table I, the second byte of the command string (the second information of the instruction) represents a hexadecimal or other value (in this example, "B1h") that indicates that the present access command is a read command and not some other command. The precise value associated with the read command is a design parameter and does not have any significance in this example other than to serve an illustrative purpose. In the slave device 104-*j* wherein the slave controller 106 has determined from the first byte of the command string that the command is destined therefore, the slave controller 106 recognizes the present command of the second byte as a read command by processing the second byte of the command string. The slave controller 106, therefore, enters a state where it becomes attentive to receipt of yet a further part of the command string requiring processing. Meanwhile, the slave controller 106 serially transfers the second byte of the command string out onto the SOP-j port after $T_{IOL-j}$ clock cycles. This is done regardless of whether the command is, or is not, destined for slave device 104-*j*.

In Table I, the third byte of the command string (the third information of the instruction) represents, in the case of a read command, a hexadecimal or other value that specifies one or more memory locations in the memory array 108, so that the contents of the specified memory locations (or memory addresses designated by, for example, banks, columns and rows) are read to provide response data. The response data is subsequently output onto the SOP-j port. Accordingly, the slave controller 106 accesses the contents of the one or more specified memory locations. The accessed data is, then, expected to be placed onto the SOP-j port, but this will be done later, in dependence upon the state of the output port enable signal $S_{OPE-j}$. If the slave controller 106 detects the activation of the output port enable signal $S_{OPE-j}$, the slave controller 106 will place the accessed data onto the SOP-j port after a further $T_{IOL-j}$ clock cycles. However, if the output port enable signal $S_{OPE-j}$ is not activated, the slave controller 106 will not place any data onto the SOP-j port. Meanwhile, the slave controller 106 serially transfers the third byte of the command out onto the SOP-j port after $T_{IOL-j}$ clock cycles, regardless of whether the command string is or is not destined for slave device 104-*j*.

Based on the foregoing, it will be observed that the read command elicits a response from slave device 104-*j*, which response includes placing data onto the SOP-j port during a time window of validity that is signaled by activation of the output port enable signal $S_{OPE-j}$. The amount of time during which the output port enable signal $S_{OPE-j}$ remains activated is related to the amount of data to be read from the memory array 108. In the embodiment system shown in FIGS. 1A and 1B, the target device, that is to respond to the read command, read (or release) data from the memory array 108 to provide response data. The response data is placed onto the SOP-j port. The slave device 104-*j* transmits the response data to the succeeding device.

Figure 2:
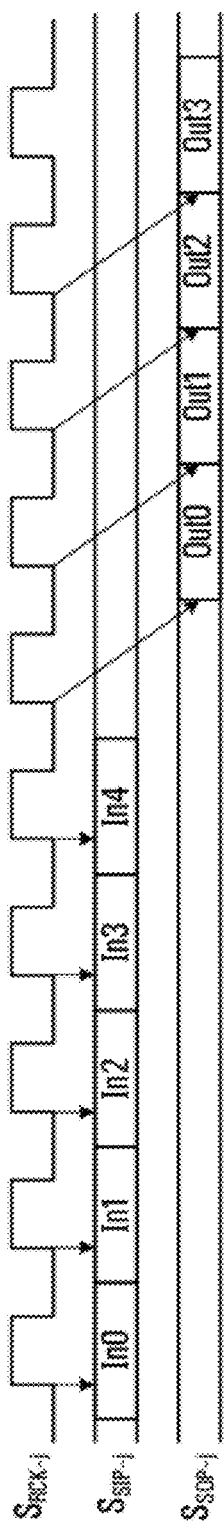
FIGS. 2, 3 and 4 are timing diagrams for a read command and the response such a command may elicit from a slave device of the type shown in FIG. 1B.
Figure 3:
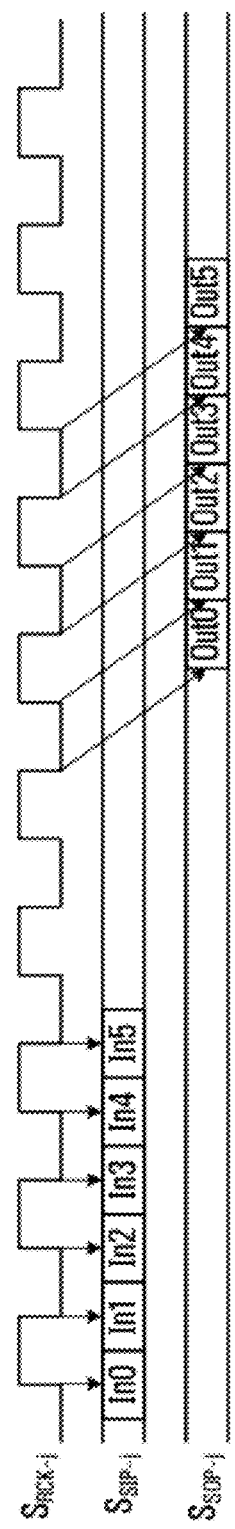
Figure 4:
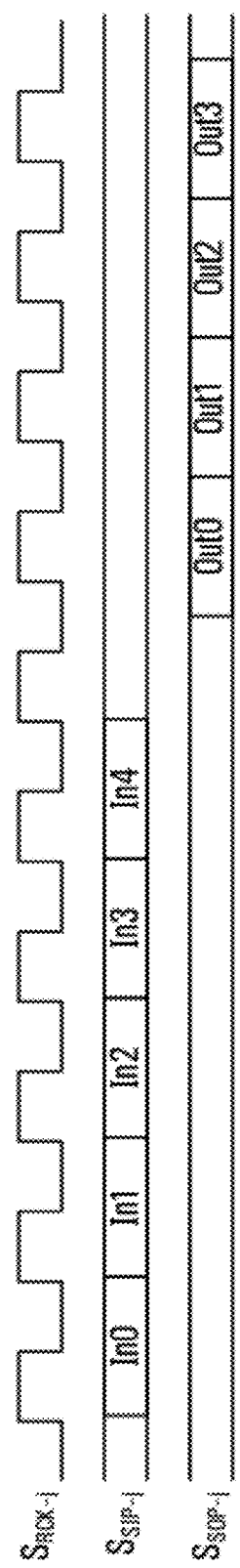

FIGS. 2, 3 and 4 show basic timing diagrams for the read command and the response it elicits from slave device 104-*j* illustrated in FIG. 1B for several possible clock signal response types (single data rate vs. double data rate) and clock signal alignment types (edge-aligned vs. center-aligned) as shown in Table II.

TABLE II

| | Clock signal response type | Clock signal alignment type |
|---|---|---|
| FIG. 2 | Single data rate (SDR) | Center |
| FIG. 3 | Double data rate (DDR) | Center |
| FIG. 4 | Single data rate (SDR) | Edge |

Figure 5:
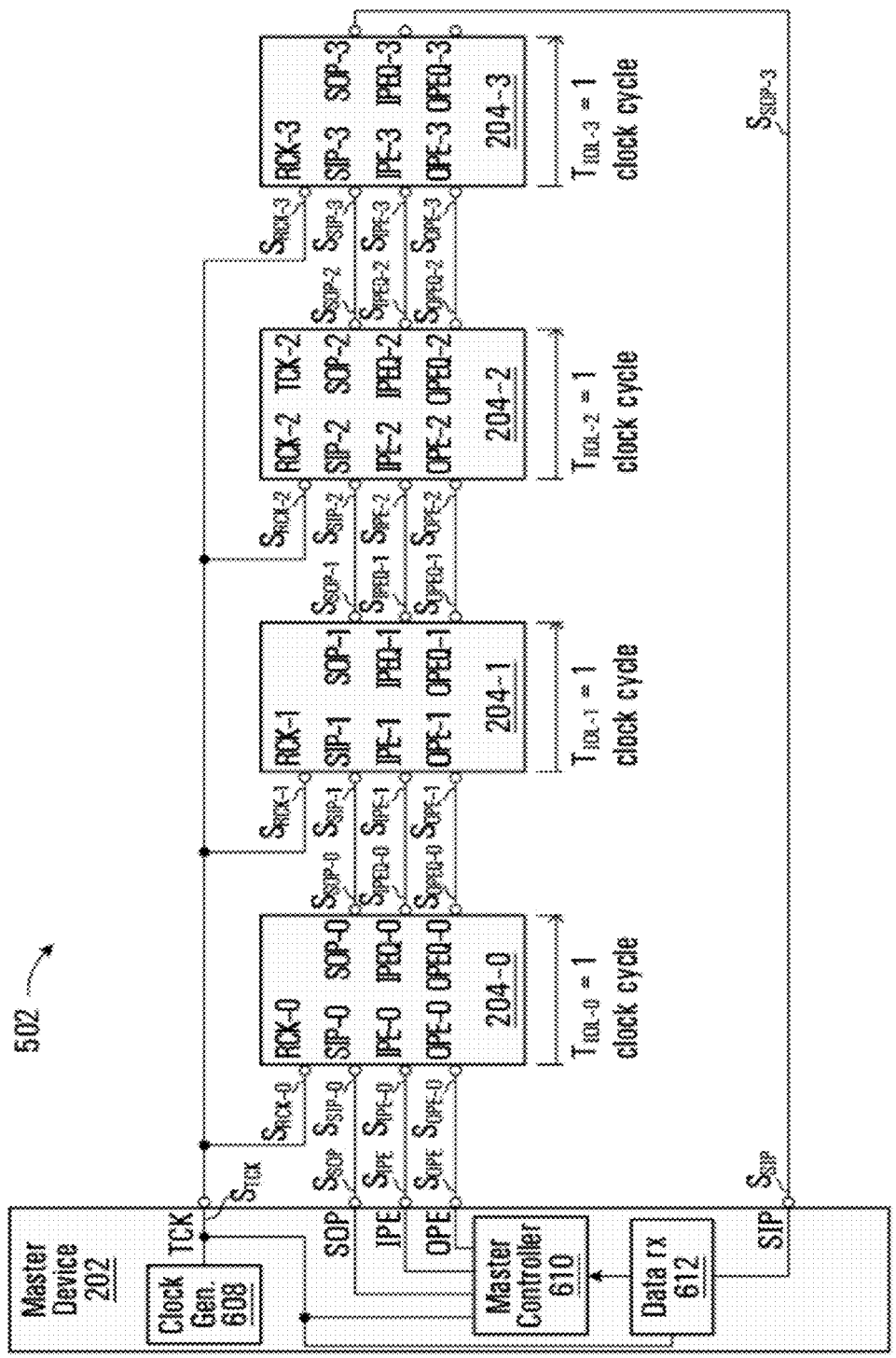
FIG. 5 is a block diagram showing a system according to an embodiment of the present invention, the system including a master device and a serial interconnection of four slave devices shown in FIGS. 1A and 1B, wherein clocks are provided in a common clock fashion.

FIG. 5 shows a system according to an embodiment of the present invention. In this particular example, the system includes a controller and a serial interconnection of a plurality of devices wherein clocks are provided in a common clock fashion. The controller and the devices correspond to the master device 102 and the slave devices 104-0 - - - 104-N−1 of FIG. 1A, respectively.

Referring to FIG. 5, a system 502 includes a master device 202 and a plurality of series-connected semiconductor devices 204-0 - - - 3, hereinafter referred to as a "serial interconnection". In the illustrated example, the system 502 includes four slave devices 204-0 - - - 3, each similar in structure to slave device 104-*j* as shown in FIG. 1B. It would be apparent to those of ordinary skill in the art that the system 502 may include any number of slave devices. By way of example, the master device 202 and the slave devices 204-0 - - - 3 may be implemented in a single multi-chip package (MCP) or as discrete units.

Each of the slave devices 204-0 - - - 3 is similar in structure to slave device 104-$j$ described earlier with reference to FIG. 1B. That is, each of the slave devices 204-0 - - - 3 has an interface compatible with the interface of slave device 104-$j$ described earlier. Accordingly, each of the slave devices 204-0 - - - 3 has an interface including a serial input port (SIP-0 - - - 3), a serial output port (SOP-0 - - - 3), an input port enable input port (IPE-0 - - - 3), an output port enable input port (OPE-0 - - - 3), an input port enable echo output port (IPEQ-0 - - - 3), an output port enable echo output port (OPEQ-0 - - - 3) and a clock input port (RCK-0 - - - 3). In addition, the interface of each of the slave devices 204-0 - - - 3 may include a chip select port (not shown) and a reset port (not shown).

It should be appreciated that different types of slave devices can be utilized as long as they have compatible serial interfaces. For example, where the slave devices 204-0 - - - 3 are memory devices, such memory devices may be of the same type (e.g., all having NAND Flash memory core), or they may be of different types (e.g., some having NAND Flash memory core and others having NOR Flash memory core). Other combinations of memory types and device types occurring to those of skill in the art are within the scope of the present invention.

The master device 202 has an interface including a plurality of output ports for providing a group of signals to a first slave device 204-0 of the serial interconnection. In the illustrated example, the interface of the master device 202 includes a master clock output port (hereinafter, the "TCK port") over which is output a master output clock signal $S_{TCK}$, a master serial output port (hereinafter, the "SOP port") over which is provided a master serial output information signal $S_{SOP}$, a master serial input port enable output port (hereinafter, the "IPE port") over which is provided a master serial input port enable signal $S_{IPE}$, and a master serial output port enable output port (hereinafter, the "OPE port") over which is provided a master serial output port enable signal $S_{OPE}$.

The interface of the master device 202 may further include various other output ports over which can be provided the chip select signal, the reset signal and various other control and data information destined for the slave devices 204-0 - - - 3.

The interface of the master device 202 further includes a master serial input port (hereinafter, the "SIP port") over which is received a master serial input information signal $S_{SIP}$ from the last slave device 204-3 of the serial interconnection.

The system 502 of FIG. 5 forms a feedforward ring type interconnection. That is to say, the output ports of the master device 202 (i.e., the SOP, IPE and OPE ports) are connected to the input ports of the first slave device 204-0 (i.e., the SIP-0, IPE-0 and OPE-0 ports, respectively), whose output ports (i.e., the SOP-0, IPEQ-0 and OPEQ-0 ports) are connected to the input ports of the second slave device 204-1 (i.e., the SIP-1, IPE-1 and OPE-1 ports, respectively). Next, the output ports of slave device 204-1 (i.e., the SOP-1, IPEQ-1 and OPEQ-1 ports) are connected to the input ports of the third slave device 204-2 (i.e., the SIP-2, IPE-2 and OPE-2 ports, respectively), whose output ports (i.e., the SOP-2, IPEQ-2 and OPEQ-2 ports) are connected to the input ports of the fourth slave device 204-3 (i.e., the SIP-3, IPE-3 and OPE-3 ports, respectively). Finally, the SOP-3 port of the fourth (i.e., the last) slave device 204-3 is connected to the SIP port of the master device 202, allowing delivery of the master serial input information signal $S_{SIP}$ (i.e., $S_{SIP-3}$) to the master device 202.

In the feedforward ring type interconnection, the other output ports of slave device 204-3 (i.e., the IPEQ-3 and OPEQ-3 ports) do not need to be connected to the master device 202.

It should also be noted that in the system 502 of FIG. 5 clocks to the devices are provided in the common clock fashion. Therefore, the TCK port of the master device 202 is commonly connected to the RCK-0, RCK-1, RCK-2 and RCK-3 ports of the devices 204-0, 204-1, 204-2 and 204-3. In other words, the master output clock signal $S_{TCK}$ is split into the various input clock signals $S_{RCK-0}$, $S_{RCK-1}$, $S_{RCK-2}$ and $S_{RCK-3}$. Embodiments where a different configuration for distribution of the master output clock signal $S_{TCK}$ are also contemplated, and some examples are described later on in greater detail.

For the purposes of simplifying the description, the system 502 shows (and the remainder of the description focuses on) single-bit-wide (×1) input and output signals. It would, however, be apparent that the input and output signals can be wider than ×1 without departing from the scope of the invention.

Figure 6:
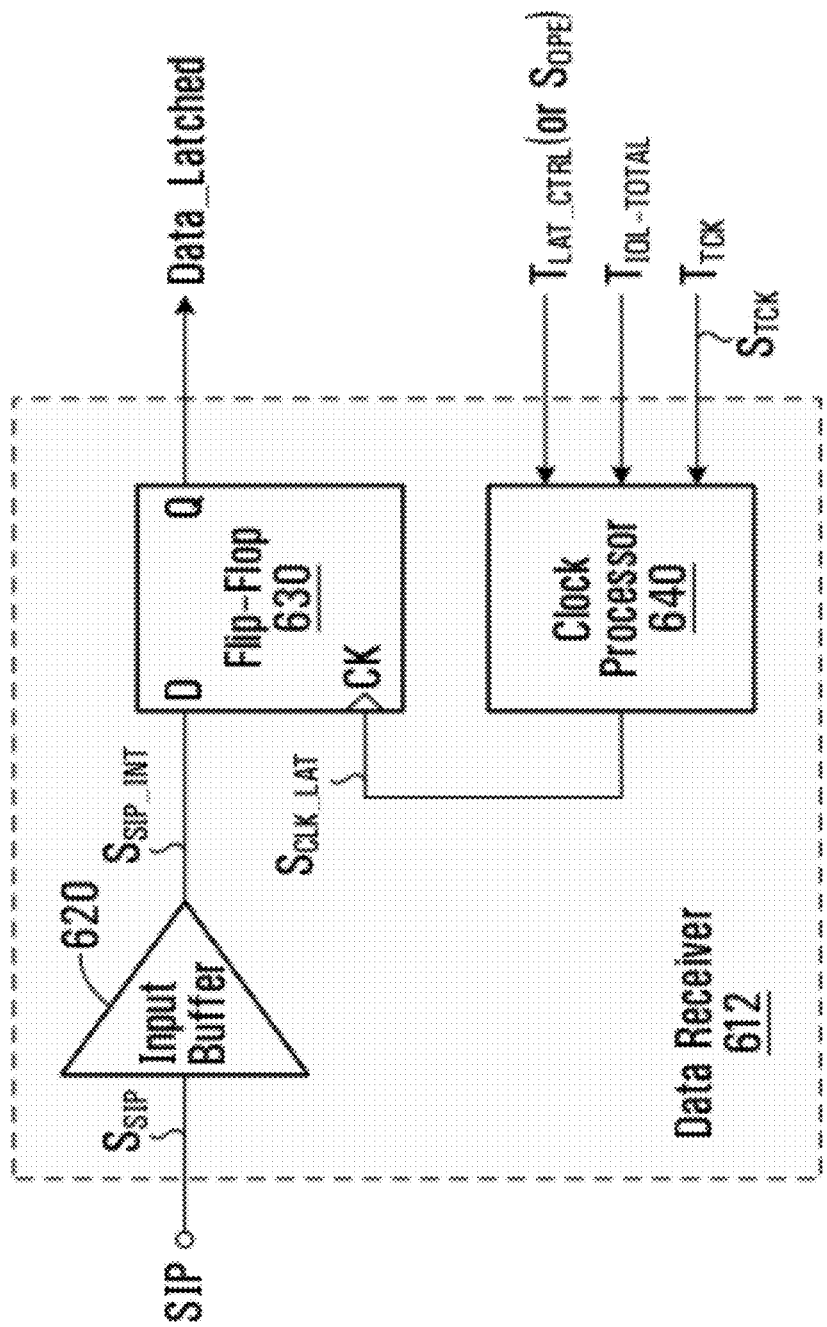
FIG. 6 is a block diagram showing details of a data receiver used by the master device in the system of FIG. 5.

The master device 202 includes a clock generator 608, a master controller 610 and a data receiver 612. The clock generator 608 generates the master output clock signal $S_{TCK}$, which is provided commonly to the slave devices 204-0 - - - 3, as well as to the master controller 610 and the data receiver 612. The master controller 610 issues command strings including access commands by controlling the master serial output information signal $S_{SOP}$, and by activating and deactivating the master input port enable signal $S_{IPE}$ and the master output port enable signal $S_{OPE}$ at the appropriate instants. In the embodiment, the signals (i.e., $S_{SIP}$, $S_{SOP}$, $S_{OPE}$) output by the master controller 610 are synchronized with generated clocks, so that the intended acquisition instants are aligned with the rising edges of the master output clock signal $S_{TCK}$. For its part, the data receiver 612 accepts responses generated by the slave devices 204-0 - - - 3 in the serial interconnection. Details of the data receiver 612 are shown in FIG. 6.

Again, referring to FIG. 5, the master controller 610 is operative to issue an access command to a "target" device. For example, the target device is the first slave device 204-0 or any other of the slave devices 204-1, 204-2, 204-3 in the serial interconnection. For notational convenience, the target device is denoted 204-$t$, where $0 \leq t \leq 3$. The master controller 610 also ensures that the master serial output information signal $S_{SOP}$ is aligned with the master serial input port enable signal $S_{IPE}$. The command is, thus, received by the first slave device 204-0 at its SIP-0 port, the command being contained in the serial input information signal $S_{SIP-0}$. The master input port enable signal is received by the first slave device 204-0 at its IPE-0 port in the form of the input port enable signal $S_{IPE-0}$.

Where the command is a read command, the master output port enable signal $S_{OPE}$ is also activated after the issuance of the command string including the first, second and third bytes as described above. The master output port enable signal $S_{OPE}$ is kept activated for a suitable length of time commensurate with the amount of read data expected from the target device 204-$t$. The master serial output port enable signal $S_{OPE}$ is, thus, received by the first slave device 204-0 at its OPE-0 port in the form of the output port enable signal $S_{OPE-0}$.

Upon receipt of the command string by the first slave device 204-0 at its SIP-0 port, the slave controller 106 in the first slave device 204-0 determines whether the first slave device 204-0 is the target device 204-$t$. This can be done by verifying the device address specified in the command string (the first byte). If the first slave device 204-0 is the target device 204-$t$, the slave controller 106 will interpret the remainder of the command string and takes action. In the specific case of a read command, the slave controller 106 in the first slave device 204-0 produces read data by accessing the contents of one or more specified locations in the memory array 108. The slave controller 106, then, waits for the output port enable signal $S_{OPE-0}$ to be activated before placing the read data onto the SOP-0 port after another $T_{IOL-0}$ clock cycles. Additionally, as already described, the slave controller 106 transfers the signals appearing at the IPE-0 and OPE-0 ports onto the IPEQ-0 and OPEQ-0 ports, respectively, after $T_{IOL-0}$ clock cycles.

If the first slave device 204-0 is not the target device 204-t, the slave controller 106 in the first slave device 204-0 simply re-transmits the received serial information towards the next slave device 204-1. That is, the slave controller 106 transfers the serial information received via the SIP-0 port onto the SOP-0 port after $T_{IOL}$ clock cycles. Additionally, as already described, the slave controller 106 transfers the signals appearing at the IPE-0 and OPE-0 ports onto the IPEQ-0 and OPEQ-0 ports, respectively, after $T_{IOL-0}$ clock cycles.

The same basic operations are performed at the next slave device 204-1, and so on. It should be noted that at some point, the information appearing on the SOP-t port (i.e., the SOP-j port of the given one of the slave devices 204-0 - - - 3, that is, the target device 204-t) contains the read data that is destined for the master device 202. The read data continues to be propagated until it is transmitted in the form of the serial output information signal $S_{SOP-3}$ by the last slave device 204-3 via its SOP-3 port. The serial output information signal $S_{SOP-3}$ containing the read data is received at the SIP port of the master device 202 in the form of the master serial input information signal $S_{SIP}$.

As can be appreciated from the above description, the master device 202 issues a read command to control the behavior of the target device 204-t in the serial interconnection by using the SIP, IPE and OPE ports. The target device 204-t, then, responds to the instructions in accordance with the command string from the master device 202 and transmits response data further along the serial interconnection. The providing of the response data by the target device 204-t follows detection by the target device that the output port enable signal received by the target device 204-t (i.e., $S_{OPE-t}$) has been activated. This signal $S_{OPE-t}$ is a version of the master output port enable signal $S_{OPE}$ delayed by $T_{IOL-j}$ at each preceding slave device in the serial interconnection (i.e., for j<t). The providing of the response data by the target device 204-t is delayed relative to activation of the master output port enable signal $S_{OPE}$ by the sum (or total) of the flow-through latencies $T_{IOL-j}$ of all devices up to and including the target device 204-t. Thereafter, the response data undergoes a further delay of $T_{IOL-j}$ at each succeeding device in the serial interconnection (i.e., for j>t). Thus, the response data appearing in the master serial input information signal $S_{SIP}$ is delayed relative to activation of the master output port enable signal $S_{OPE}$ by a total flow-through latency of the serial interconnection, denoted $T_{IOL-TOTAL}$, where $T_{IOL-TOTAL} = \Sigma_j T_{IOL-j}$.

Ultimately, therefore, the master device 202 begins to receive the response data via its SIP port at a time instant. The reception of the response data is delayed relative to activation of the master output port enable signal $S_{OPE}$ by $T_{IOL-TOTAL}$. This time instant is not, however, apparent from the content of the master serial input information signal $S_{SIP}$ itself. Rather, the appropriate time instant for beginning to consider the data on the master serial input information signal $S_{SIP}$ as valid data needs to be determined and taken into consideration.

To this end, in the present embodiment of a feedforward ring type interconnection, and with reference to FIG. 6, the data receiver 612 includes an input buffer 620, a D-type flip-flop (D-FF) 630 and a clock processor 640. The D-FF 630 functions as latching circuitry for latching input data.

The input buffer 620 receives the master serial input information signal $S_{SIP}$ arriving at the SIP port of the master device 202. The input buffer 620 outputs an intermediate signal $S_{SIP\_INT}$, which is fed to a data input of the D-FF 630. The intermediate signal $S_{SIP\_INT}$ is, thus, a slightly delayed version of the master serial input information signal $S_{SIP}$ by the input buffer 620. The D-FF 630 operates to transfer the signal at its data input (D) (i.e., the intermediate signal $S_{SIP\_INT}$) onto a data output (Q) in dependence upon a latch clock signal $S_{CLK\_LAT}$. The latch clock signal $S_{CLK\_LAT}$ is supplied by the clock processor 640, which is now described.

The clock processor 640 receives a version of the master output clock signal $S_{TCK}$ that is output by the master controller 610 via the TCK port of the master device 202. The version of the master output clock signal $S_{TCK}$ supplied to the clock processor 640 can be obtained by tapping the master output clock signal $S_{TCK}$ at the output of the master controller 610 or via a mechanism (not shown) internal to the master device 202. The clock processor 640 also receives a latency control signal $T_{LAT\_CTRL}$ that is triggered by the master device 202 when the master output port enable signal $S_{OPE}$ is activated. In another embodiment, the master output port enable signal $S_{OPE}$ is provided directly to the clock processor 640 instead of the latency control signal $T_{LAT\_CTRL}$. The clock processor 640 also receives the total flow-through latency $T_{IOL-TOTAL}$, which in the present embodiment can be predicted based on knowledge of the device type(s) and number of slave devices in the serial interconnection. By way of example, in the illustrated embodiment, the total flow-through latency $T_{IOL-TOTAL}$ is predicted to be four clock cycles. In another embodiment, rather than being received as an external signal or variable, the total flow-through latency $T_{IOL-TOTAL}$ may be pre-programmed in the clock processor 640.

An example of the clock processor 640 includes a counter (not shown) that starts counting incoming pulses of the master output clock signal $S_{TCK}$ after the master output port enable signal $S_{OPE}$ is activated. When the count reaches the value (or number) of the total flow-through latency $T_{IOL-TOTAL}$, the counter starts outputting pulses in the latch clock signal $S_{CLK\_LAT}$. While the master output clock signal $S_{TCK}$ is deactivated, the counter continues outputting pulses. When the count reaches the value of the total flow-through latency $T_{IOL-TOTAL}$ after the deactivation, the counter ceases outputting pulses in the latch clock signal $S_{CLK\_LAT}$. Thus, the start and end of the producing of clocks of the latch clock signal $S_{CLK\_LAT}$ are delayed by the total flow-through latency $T_{IOL-TOTAL}$ after the activation and the deactivation of the master output port enable signal $S_{OPE}$.

In the example shown in FIG. 5, it is assumed that the devices 204-0 - - - 204-3 of the serial interconnection are the same type device, e.g., NAND flash devices, and each of the input-to-output (or the flow-through) latencies $T_{IOL-0}$ - - - $T_{IOL-3}$ is the same value, namely one clock cycle. Therefore, the total flow-through latency $T_{IOL-TOTAL}$ is four cycles. The value of four cycles as the predicted total flow-through latency $T_{IOL-TOTAL}$ is provided to the clock processor 640 of the data receiver 612 by an appropriate manner. Devices of other types may have different flow-through latencies. In the illustrated example, while the flow-through latencies of the devices are different, the total flow-through latency $T_{IOL-TOTAL}$ is predicted.

In order to generate the latch clock signal $S_{CLK\_LAT}$, the clock processor 640 is operable to monitor activation of the latency control signal $T_{LAT\_CTRL}$ (or the master output port enable signal $S_{OPE}$), following which it begins counting clock cycles of the master output clock signal $S_{TCK}$. During this time, the latch clock signal $S_{CLK\_LAT}$ is inactive, and the D-FF 630 is not transferring the signal at its data input to its data output. When the number of clock cycles of the master output clock signal $S_{TCK}$ reaches the number of clock cycles specified by the total flow-through latency $T_{IOL-TOTAL}$, the latch clock signal $S_{CLK\_LAT}$ is, then, set to begin replicating the master output clock signal $S_{TCK}$. This establishes acquisition time instants of the D-FF 630, allowing its data input to be transferred to its data output. The transferred data is processed by other circuitry (not shown) in the master device 202. Prior to this moment (i.e., for the past $T_{IOL-TOTAL}$ clock cycles), the contents of the master serial input information signal $S_{SIP}$ are ignored. When the latency control signal $T_{LAT\_CTRL}$ (or the master output port enable signal $S_{OPE}$) is no longer activated, the clock processor 640 continues to allow the latch clock signal $S_{CLK\_LAT}$ to replicate the master output clock signal $S_{TCK}$ for another $T_{IOL-TOTAL}$ clock cycle, and then finally the latch clock signal $S_{CLK\_LAT}$ is deactivated.

Thus, the latch clock signal $S_{CLK\_LAT}$ takes into account the flow-through latency $T_{IOL-TOTAL}$, which in the present example corresponds to four clock cycles. The activation of the latch clock signal $S_{CLK\_LAT}$ corresponds to the onset of a time window during which the master serial input information signal $S_{SIP}$ (or the slightly delayed intermediate signal $S_{SIP\_INT}$) is known to validly carry data. The data is output by the target device via the last slave device 204-3 in the serial interconnection (or just the target device if it is itself the last slave device in the serial interconnection). It will, thus, be appreciated that the contents of the intermediate signal $S_{SIP\_INT}$ latched by the master device 202 (the D-FF 630) allow timely capture of the response data actually sent by the target device.

The latched data "Data_Latched" is provided to the master controller 610 of the master device 202.

Figure 7:
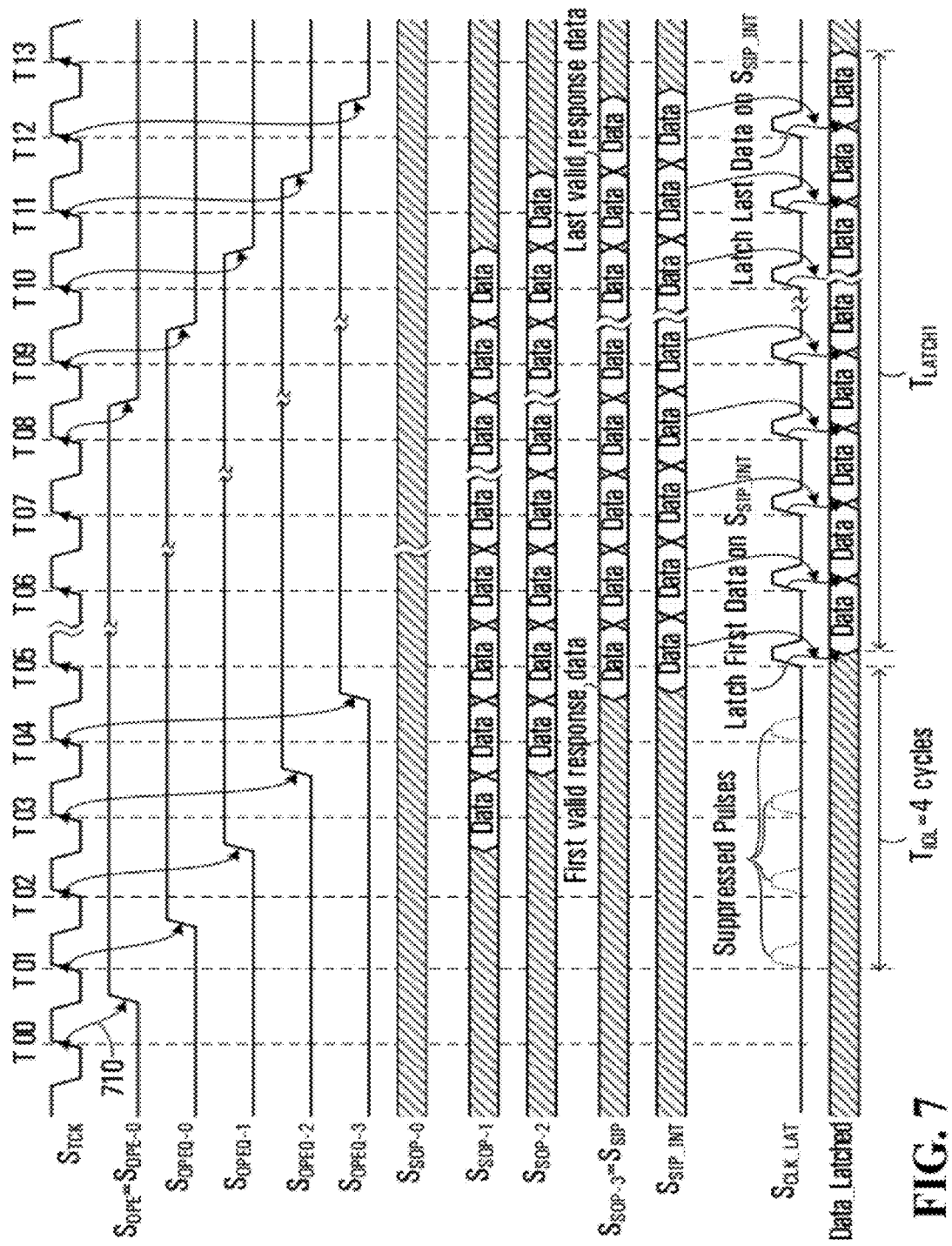
FIG. 7 is a timing diagram illustrating the behaviour of various signals exchanged among the master device and the slave devices in the system of FIG. 5.

FIG. 7 shows a timing diagram that depicts the various signals in FIGS. 5 and 6. Referring to FIGS. 5, 6 and 7, there are the master output clock signal $S_{TCK}$, the master output port enable signal $S_{OPE}$ (equivalent to the output port enable signal $S_{OPE-0}$), the echo signals $S_{OPEQ-0}$, $S_{OPEQ-1}$, $S_{OPEQ-2}$ and $S_{OPEQ-3}$ (equivalent to the master echo signal $S_{OPEQ}$), the output information signals $S_{SOP-0}$, $S_{SOP-1}$, $S_{SOP-2}$ and $S_{SOP-3}$ (equivalent to the master serial input information signal $S_{SIP}$), the intermediate signal $S_{SIP\_INT}$, the latch clock signal $S_{CLK\_LAT}$, and the latched data "Data_Latched" at the data output of the D-FF 630. In this case, it is seen that the target device 204-t is slave device 204-1, as evidenced by the first appearance of response data on the output information signal $S_{SOP-1}$ following time T02, which is $T_{IOL-0}=1$ clock cycle following the activation of the master output port enable signal $S_{OPE}$ at time T01.

As shown in the example timing diagram of FIG. 7, the master controller 610 activates the master output port enable signal $S_{OPE}$ in response to the rising edge of the master output clock signal $S_{TCK}$ at time T00. This is illustrated for the master output port enable signal $S_{OPEQ}$ by an arrow 710 between times T00 and T01. Thus, the master output port enable signal $S_{OPE}$ has stabilized by the time the master output clock signal $S_{TCK}$ presents a subsequent rising edge at time T01. Assuming that slave device 204-1 is the target device 204-t (based on a previous selection made by virtue of a read command issued by the master device 202), it is the only device to be responsive to a received output port enable signal. Thus, only the device 204-1 recognizes the device address. The first slave device 204-0 does not respond to activation of the output port enable signal $S_{OPE-0}$ and just forwards both it and the input information signal $S_{SIP-0}$ to the OPEQ-0 and SOP-0 ports, respectively, with $T_{IOL-0}=1$ clock cycle of latency.

Slave device 204-1 detects activation of the output port enable signal $S_{OPE-1}$ (which is equivalent to $S_{OPEQ-0}$) at time T02 and is responsive thereto. The slave device 204-1, then, starts producing response data through its SOP-1 port. The response data is stabilized by the time the input clock signal $S_{RCK-1}$ (which is equivalent to $S_{TCK}$) presents a next rising edge at time T03. Therefore, the slave device 204-1 responds to the master device 202 and outputs the response data, From this point, valid response data from slave device 204-1 flows through the SIP-j and SOP-j ports of the remaining slave devices synchronized with the input clock signals, which are equivalent to the master output clock signal $S_{TCK}$, as shown in FIG. 7.

The data receiver 612 of the master device 202, then, receives the master serial input information signal $S_{SIP}$ (which corresponds to the serial output information signal $S_{SOP-3}$) from the last slave device 204-3 in the serial interconnection. $S_{SIP}$ will contain the valid response data if sampled starting at time T05, i.e., after a total of $T_{IOL-TOTAL}=4$ clock cycles in this example. Thus, in the particular example, the total flow-through latency $T_{IOL-TOTAL}$ is four clock cycles. The first to last valid response data, as the master serial input information signal $S_{SIP}$ (or the serial output information signal $S_{SOP-3}$), is transmitted to the data receiver 612 in response to the clock signal.

Meanwhile, the data receiver 612 produces the latch clock signal $S_{CLK\_LAT}$ (whose rising edges establish the acquisition instants for the D-FF 630) as described above, based on activation of the latency control signal $T_{LAT\_CTRL}$ (or the master output port enable signal $S_{OPE}$) after time T00. The latch clock signal $S_{CLK\_LAT}$ is synchronized with the master output clock signal $S_{TCK}$. In accordance with the value (i.e., four cycles) of the total flow-through latency $T_{IOL-TOTAL}$, the first four clock pulses of the master output clock signal $S_{TCK}$ are suppressed by the clock processor 640 at times T01, T02, T03, T04 following activation of the latency control signal $T_{LAT\_CTRL}$ (or the master output port enable signal $S_{OPE}$) after time T00. Therefore, after the suppression of four clock pulses, a sequence of pulses occurs in the latch clock signal $S_{CLK\_LAT}$ from the clock processor 640. In FIG. 7, a dashed extension of the latch clock signal $S_{CLK\_LAT}$ shows these four suppressed pulses. The four pulses shown by the dashed extension are not generated because of total latency of four cycles.

As the result, the occurrence of clock pulses of the latch clock signal $S_{CLK\_LAT}$ is delayed relative to the master output port enable signal $S_{OPE}$ by the same total flow-through latency $T_{IOL\_TOTAL}$. So is the response data contained in the master serial input information signal $S_{SIP}$. The acquisition instants established by the rising edge of the first clock pulse in the latch clock signal $S_{CLK\_LAT}$ correctly signals the onset of valid data in the intermediate signal $S_{SIP\_INT}$. Thus, the D-FF 630 begins to correctly latch valid response data in the intermediate signal $S_{SIP\_INT}$, which, as can be seen, is a slightly delayed version of the master serial input information signal $S_{SIP}$. $S_{Sip}$ is equivalent to the serial output information signal $S_{SOP-3}$ provided by the last slave device 204-3 in the serial interconnection. The first to last valid response data contained in $S_{SIP\_INT}$ is sequentially latched by the D-FF 630 and the latched data is sequentially output as the "Data_Latched" from its output (Q) in response to the generated latch clock signal $S_{CLK\_LAT}$ during a latch period $T_{LATCH1}$, as shown in FIG. 7.

The first clock pulse of the latch clock signal $S_{CLK\_LAT}$ is generated after the suppression period of the four clock cycles following the activation of the latency control signal $T_{LAT\_CTRL}$ (or the master output port enable signal $S_{OPE}$). Upon receipt of the first clock pulse of the latch clock signal $S_{CLK\_LAT}$, the D-FF 630 starts the data latching. Thus, the data latching by the D-FF 630 is delayed based on the total flow-through latency $T_{IOL\text{-}TOTAL}$. Such data latching continues in response to the succeeding clock pulses of the latch clock signal $S_{CLK\text{-}LAT}$ until the deactivation of the echo signal $S_{OPEQ\text{-}3}$. Thus, the latch period $T_{LATCH1}$ is determined by the activation and deactivation of the echo signal $S_{OPEQ\text{-}3}$. The last clock pulse of the latch clock signal $S_{CLK\_LAT}$ is generated after the same period of four clock cycles after the deactivation of or the master output port enable signal $S_{OPE}$).

The circuit of FIG. 6 is just an example. Any modifications and variations of the circuit of FIG. 6 to achieve the desired functionality are considered to be within the scope of the present invention. The D-FF 630 is one example of latching circuitry. Also, the clock processor 640 is one example of clock signal circuitry in response to clock pulse production activation (e.g., the master output port enable signal $S_{OPE}$) and an input control (e.g., the total flow-through latency $T_{IOL\text{-}TOTAL}$). In the clock signal circuitry, clock pulses are continuously produced in response to the pulse production activation, but the start and end of the pulse production are delayed by the control value of the input control. It would be apparent to those skilled in the art that both or either of the data latching function and the latch clock producing function can be achieved by numerous other circuits and devices.

It should be appreciated that in some cases, it may not be possible to know, in advance, the total flow-through latency $T_{IOL\text{-}TOTAL}$. For example, the master device 202 may not know the flow-through latency of each individual slave device. Alternatively, a master device may know the nominal flow-through latency of the various slave devices for a given frequency but changes to the total flow-through latency due to operation of the system at a different frequency may not be known. In such cases, it may be advantageous to use a feedback ring type interconnection, as is now described with reference to FIG. 8.

Figure 8:
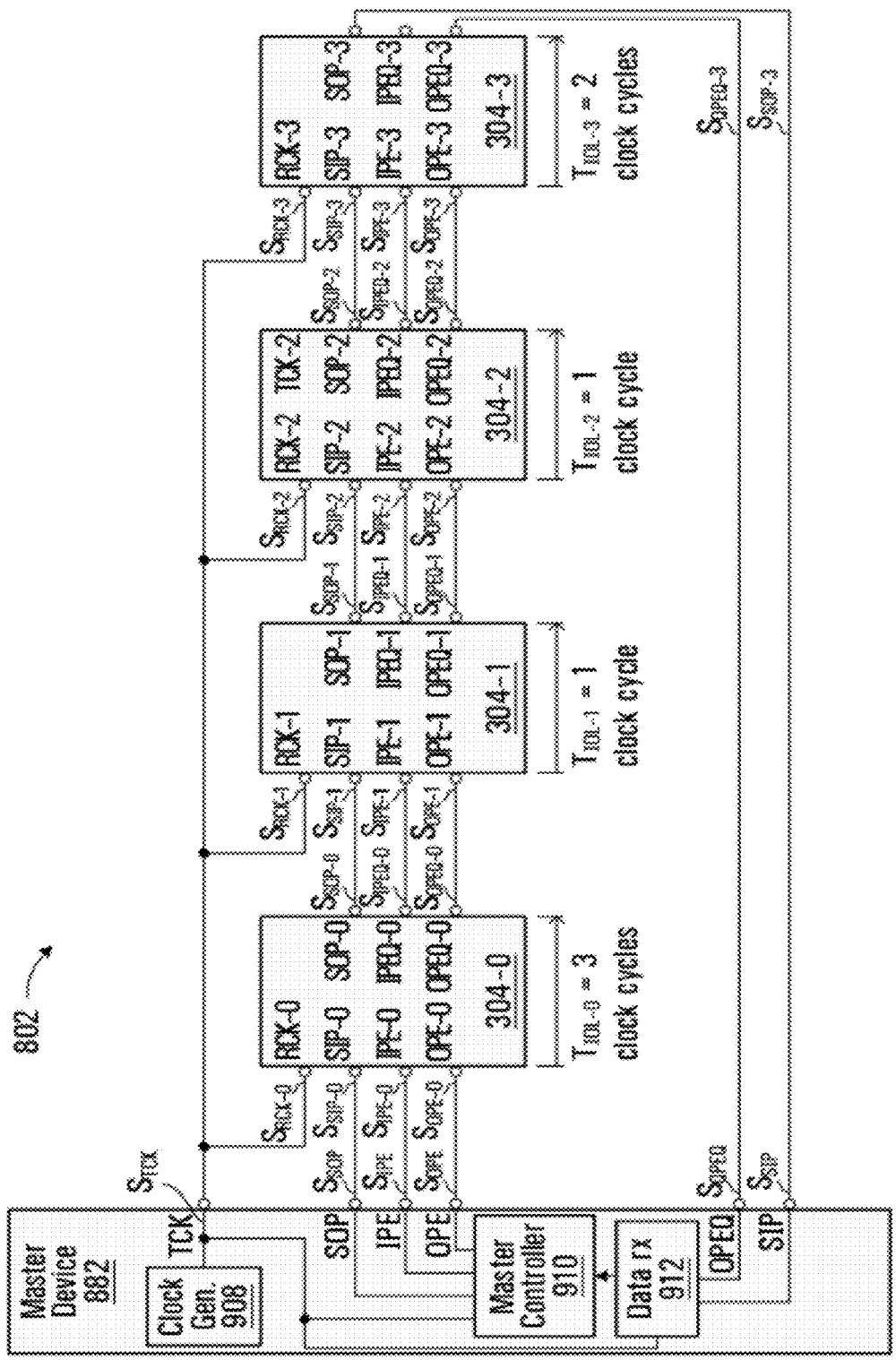
FIG. 8 is a block diagram showing a system according to another embodiment of the present invention, the system including a master device and a serial interconnection of four slave devices shown in FIG. 1B, wherein clocks are provided in a common clock fashion.

FIG. 8 shows a system according to another embodiment of the present invention, the system including a controller and a serial interconnection of a plurality of devices wherein clocks are provided in a common clock fashion.

Referring to FIG. 8, a system 802 includes a master device 882 and a serial interconnection of semiconductor devices. In the illustrated example, the serial interconnection includes four semiconductor devices 304-0 - - - 3. It would be apparent to those of ordinary skill in the art that the system 802 may include any number of slave devices. The semiconductor devices 304-0 - - - 3 are similar to the devices 204-0 - - - 204-3 of FIG. 5. For the purposes of the present example, consider that each memory device in the serial interconnection configuration has variable flow-through latency. For example, the flow-through latencies of the devices 304-0, 304-1, 304-2 and 304-3 are $T_{IOL\text{-}0}$=3 clock cycles, $T_{IOL\text{-}1}$=1 clock cycle, $T_{IOL\text{-}2}$=1 clock cycle and $T_{IOL\text{-}3}$=2 clock cycles, respectively. Therefore, in this particular example, the total flow-through latency $T_{IOL\text{-}TOTAL}$ is seven clock cycles. It will be appreciated that a given device's flow-through latency $T_{IOL\text{-}j}$ may be variable depending upon the variation of power supply level and/or temperature inside the given device. Moreover, the variable flow-through latency $T_{IOL\text{-}j}$ may be controlled by the master device 882, or can be adjusted by the given device itself using a built-in temperature sensor (not shown). In this situation, the master device 882 is unable to know the total flow-through latency $T_{IOL\text{-}TOTAL}$.

The master device 882 is similar to the master device 202 of FIG. 5. The master device 882 of FIG. 8 has an interface comprising a plurality of output ports for providing a group of signals to a first slave device 304-0 of the serial interconnection. The interface of the master device 882 includes a master clock output port (hereinafter, the "TCK port") over which is output a master output clock signal $S_{TCK}$, a master serial output port (hereinafter, the "SOP port") over which is provided a master serial output information signal $S_{SOP}$, a master serial input port enable output port (hereinafter, the "IPE port") over which is provided a master serial input port enable signal $S_{IPE}$, and a master serial output port enable output port (hereinafter, the "OPE port") over which is provided a master serial output port enable signal $S_{OPE}$.

The interface of the master device 882 may further comprise various other output ports over which can be provided the chip select signal, the reset signal and various other control and data information destined for the slave devices 304-0 - - - 3.

The interface of the master device 882 includes a master serial input port (hereinafter, the "SIP port") over which is received a master serial input information signal $S_{SIP}$ from the last slave device 304-3 of the serial interconnection.

In addition, the interface of the master device 882 further includes a master output port enable echo input port (hereinafter, the "OPEQ" port) over which is received a master echo signal $S_{OPEQ}$ from the last slave device 304-3 of the serial interconnection.

As with the system 502 of FIG. 5, the output ports of the master device 882 in the system 802 (i.e., the SOP, IPE and OPE ports) are connected to the input ports of the first slave device 304-0 (i.e., the SIP-0, IPE-0 and OPE-0 ports, respectively), whose output ports (i.e., the SOP-0, IPEQ-0 and OPEQ-0 ports) are connected to the input ports of the second slave device 304-1 (i.e., the SIP-1, IPE-1 and OPE-1 ports, respectively). Similarly, the output ports of slave device 304-1 (i.e., the SOP-1, IPEQ-1 and OPEQ-1 ports) are connected to the input ports of the third slave device 304-2 (i.e., the SIP-2, IPE-2 and OPE-2 ports, respectively), whose output ports (i.e., the SOP-2, IPEQ-2 and OPEQ-2 ports) are connected to the input ports of the fourth (i.e., the last) slave device 304-3 (i.e., the SIP-3, IPE-3 and OPE-3 ports, respectively).

In the feedback ring type interconnection of FIG. 8, the SOP-3 port and the OPEQ-3 port of the last slave device 304-3 are connected to the SIP port and the OPEQ port of the master device 882, respectively. The feed back connection of the SOP-3 and SIP ports allows delivery of the master serial input information signal $S_{SIP}$ to the master device 882. The feedback connection of the OPEQ-3 and OPEQ ports allows delivery of the master echo signal $S_{OPEQ}$ to the master device 882. However, the IPEQ-3 port of slave device 304-3 does not need to be connected to the master device 882.

It should also be noted that in this embodiment, the TCK port is commonly connected to the RCK-0, RCK-1, RCK-2 and RCK-3 ports of the devices 304-0, 304-1, 304-2 and 304-3 of the serial interconnection.

Figure 9:
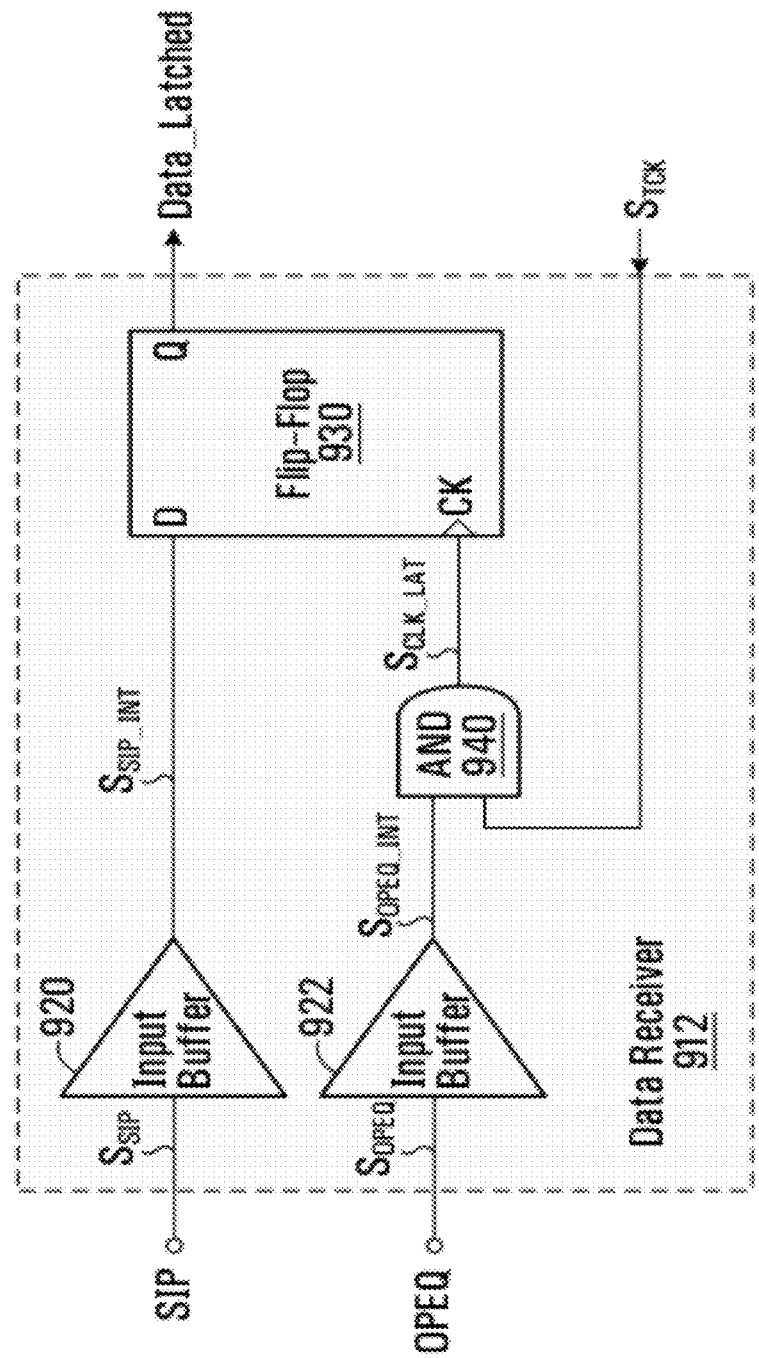
FIG. 9 is a block diagram showing details of a data receiver used by the master device in the system of FIG. 8.

With continued reference to FIG. 8, the master device 882 is now described in greater detail. The master device 882 includes a clock generator 908, a master controller 910 and a data receiver 912. The clock generator 908 and the master controller 910 can be identical to the clock generator 608 and the master controller 610 of FIG. 5, respectively. The clock generator 908 generates the master output clock signal $S_{TCK}$, which is distributed to the slave devices 304-0 - - - 3, as well as to the master controller 910 and the data receiver 912. The master controller 910 issues commands, activates the master input port enable signal $S_{IPE}$ and the master output port enable signal $S_{OPE}$ at the appropriate instants. In the present embodiment, the signals output by the master controller 910 are timed, so that the intended acquisition instants are aligned with the falling edges of the master output clock signal $S_{TCK}$. For its part, the data receiver 912 accepts responses generated by the slave devices 304-0 - - - 3 in the serial interconnection. The date receiver 912 is different from the data receiver 612 of FIG. 6. A detail of the data receiver 912 is shown in FIG. 9.

Again referring to FIG. 8, the master controller 910 is operative to issue a command (e.g., in a form of a command string) to a "target" device in the serial interconnection. For example, the target device is the first slave device 304-0 or any other of the slave devices 304-1, 304-2, 304-3. For notational convenience, the target device is denoted 304-t, where $0 \leq t \leq 3$. The master controller 910 also ensures that the master serial output information signal $S_{SOP}$ is aligned with the master serial input port enable signal $S_{IPE}$. The command is, thus, received by the first slave device 304-0 at its SIP-0 port, the command being contained in the serial input information signal $S_{SIP-0}$. The master input port enable signal $S_{IPE}$ is received by the first slave device 304-0 at its IPE-0 port in the form of the input port enable signal $S_{IPE-0}$.

Where the command is a read command (see above Table I), the master output port enable signal $S_{OPE}$ is, also, activated after the first, second and third bytes of the command string is issued as described above. The master output port enable signal $S_{OPE}$ is kept activated for a suitable length of time commensurate with the amount of data expected from the target device 304-t. The master serial output port enable signal $S_{OPE}$ is, thus, received by the first slave device 304-0 at the its OPE-0 port in the form of the output port enable signal $S_{OPE-0}$. The behavior of the slave devices 304-0 - - - 3 is the same as has already been described referring to the slave devices 204-0 - - - 3 shown in FIG. 5.

Referring to FIG. 8, the master device 882 issues a command string including a read command to control the behavior of the target device 304-t in the serial interconnection by using the SIP, IPE and OPE ports. The target device 304-t, then, responds to the instructions from the master device 882, the instructions being in accordance with the command string. The target device 304-t transmits read data further along the serial interconnection. The release of the response data by the target device 304-t follows detection by the target device that the output port enable signal received by the target device 304-t (i.e., $S_{OPE-t}$) is activated. This signal $S_{OPE-t}$ is a version of the master output port enable signal $S_{OPE}$ that is delayed by $T_{IOL-j}$ at each preceding slave device in the serial interconnection. The release of the response data by the target device 304-t is delayed relative to activation of the master output port enable signal $S_{OPE}$ by the sum (or total) of the flow-through latencies $T_{IOL-j}$ of all devices up to and including the target device 304-t. Thereafter, the response data undergoes a further delay of $T_{IOL-j}$ at each succeeding device in the serial interconnection. Thus, the response data appearing in the master serial input information signal $S_{SIP}$ is delayed relative to activation of the master output port enable signal $S_{OPE}$ by a total flow-through latency of the serial interconnection, denoted $T_{IOL-TOTAL}$, where $T_{IOL-TOTAL} = \Sigma_j T_{IOL-j}$.

The master device 882 begins to receive the response data via its SIP port at a time instant. The reception of the response data is delayed relative to activation of the master output port enable signal $S_{OPE}$ by $T_{IOL-TOTAL}$. Although this time instant is not apparent from the content of the master serial input information signal $S_{SIP}$ itself, it is apparent from the master echo signal $S_{OPEQ}$. Specifically, the master echo signal $S_{OPEQ}$ is a propagated version of the master output port enable signal $S_{OPE}$, it has undergone the same delay as the master serial input information signal $S_{SIP}$, corresponding to the total flow-through latency $T_{IOL-TOTAL}$. Thus, processing of the master echo signal $S_{OPEQ}$ can permit the master device 882 to extract valid data from the master serial input information signal $S_{SIP}$.

FIG. 9 shows details of the data receiver 912 of FIG. 8. Referring to FIGS. 8 and 9, in the present embodiment of a feedback ring type interconnection, the data receiver 912 includes a first input buffer 920, a second input buffer 922, a D-FF 930 and an AND gate 940. The D-FF 930 functions as latching circuitry. The first input buffer 920 receives the master serial input information signal $S_{SIP}$ arriving at the SIP port of the master device 882 from the last device 304-3. The first input buffer 920 outputs an intermediate signal $S_{SIP\_INT}$, which is fed to a data input of the D-FF 930. The intermediate signal $S_{SIP\_INT}$ is, thus, a slightly delayed version of the master serial input information signal $S_{SIP}$. The second input buffer 922 receives the master echo signal $S_{OPEQ}$ arriving at the OPEQ port of the master device 882 from the last device 304-3. The second input buffer 922 outputs an intermediate echo signal $S_{OPEQ\_INT}$, which is a slightly delayed version of the master echo signal $S_{OPEQ}$.

The D-FF 930 operates to transfer the signal at its data input (D) (i.e., the intermediate signal $S_{SIP\_INT}$) onto a data output (Q) in dependence upon a latch clock signal $S_{CLK\_LAT}$. This latch clock signal $S_{CLK\_LAT}$ is supplied by the AND gate 940, which applies a logical AND operation on the signals present at its two inputs. The signal at one of the inputs of the AND gate 940 is a version of the master output clock signal $S_{TCK}$. The version of the master output clock signal $S_{TCK}$ supplied to the clock processor 640 can be obtained by tapping the master output clock signal $S_{TCK}$ at the output of the master controller 910 or via a mechanism internal to the master device 882. The signal at the other one of the inputs of the AND gate 940 is the intermediate echo signal $S_{OPEQ\_INT}$, received from the second input buffer 922.

The latch clock signal $S_{CLK\_LAT}$ is the result of logical ANDING of the master output clock signal $S_{TCK}$ and the intermediate echo signal $S_{OPEQ\_INT}$. The master echo signal (and hence the intermediate echo signal $S_{OPEQ\_INT}$) is delayed relative to the master output port enable signal $S_{OPE}$ by the total flow-through latency $T_{IOL-TOTAL}$. Therefore, the D-FF 930 only begins transferring the data at its data input (i.e., the data carried by the intermediate signal $S_{SIP\_INT}$) to its data output after a delay of $T_{IOL-TOTAL}$ clock cycles following activation of the master output port enable signal $S_{OPE}$. This is the same delay experienced by the response data present in the master serial input information signal $S_{SIP}$ (or the slightly delayed intermediate signal $S_{SIP\_INT}$) relative to activation of the master output port enable signal $S_{OPE}$. The activation of the latch clock signal $S_{CLK\_LAT}$ corresponds to the onset of a time window during which the master serial input information signal $S_{SIP}$ (or the slightly delayed intermediate signal $S_{SIP\_INT}$) is known to validly carry data. The data is output by the target device via the last slave device 304-3 or just the target device if it is itself the last slave device, in the serial interconnection. Thus, the contents of the intermediate signal $S_{SIP\_INT}$ latched by the circuitry of the master device 882 allow timely capture of the response data actually sent by the target device.

Figure 10:
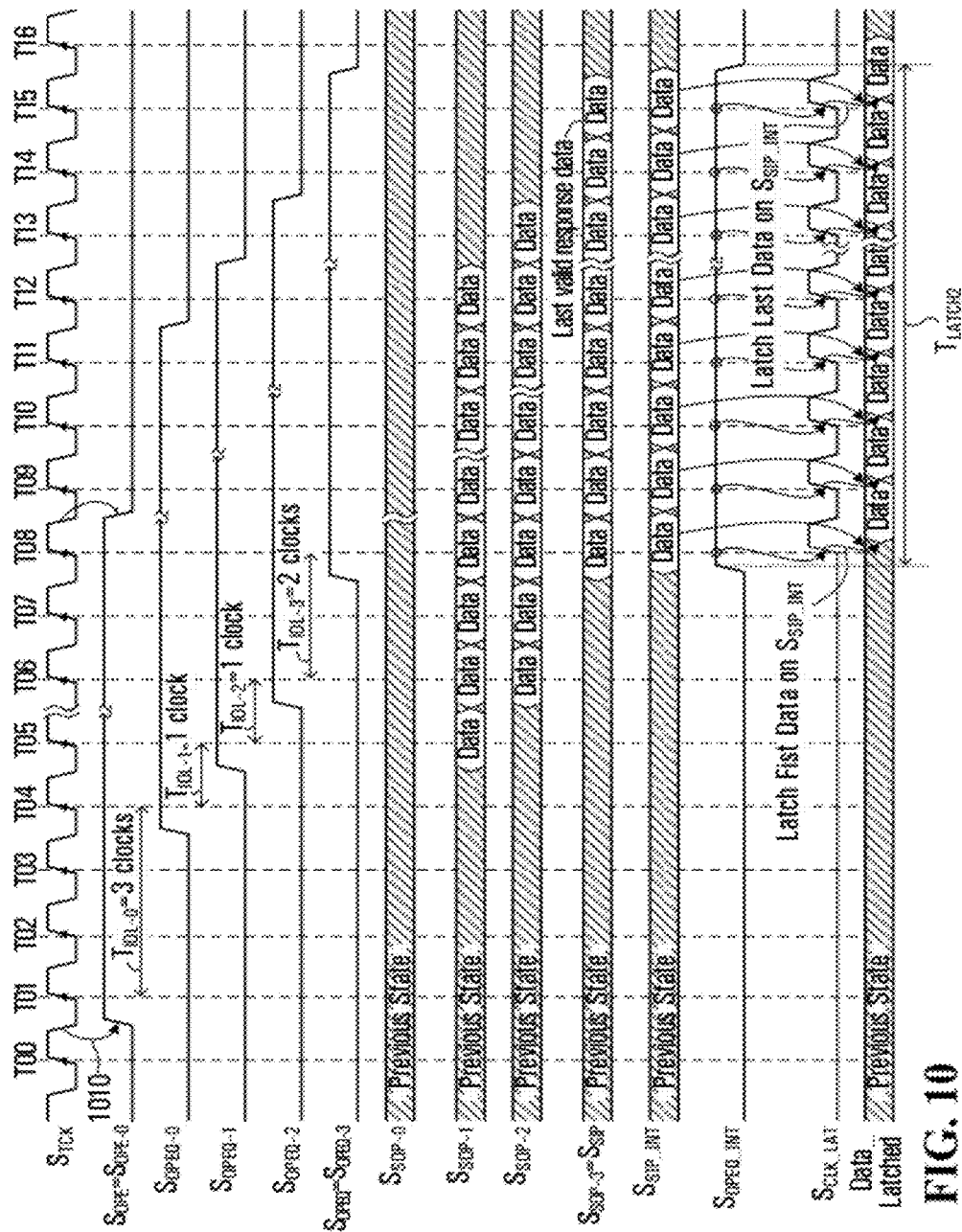
FIG. 10 is a timing diagram illustrating the behaviour of various signals exchanged among the master device and the slave devices in the system of FIG. 8.

FIG. 10 shows various signals in FIGS. 8 and 9, the signals including the master output clock signal $S_{TCK}$, the master output port enable signal $S_{OPE}$ (equivalent to the output port enable signal $S_{OPE-0}$ from the last device 304-3), the echo signals $S_{OPEQ\text{-}0}$, $S_{OPEQ\text{-}1}$, $S_{OPEQ\text{-}2}$ and $S_{OPEQ\text{-}3}$ (equivalent to the master echo signal $S_{OPEQ}$ the output information signals $S_{SOP\text{-}0}$, $S_{SOP\text{-}1}$, $S_{SOP\text{-}2}$ and $S_{SOP\text{-}3}$ (equivalent to the master serial input information signal $S_{SIP}$), the intermediate signal $S_{SIP\_INT}$, the intermediate echo signal $S_{OPEQ\_INT}$, the latch clock signal $S_{CLK\_LAT}$, and the latched data at the data output of the D-FF 930. In this case, it is seen that the target device 304-$t$ is slave device 304-1, as evidenced by the first appearance of response data on the output information signal $S_{SOP\text{-}1}$ following time T04, which is $T_{IOL\text{-}0}=3$ clock cycles following the activation of the master output port enable signal $S_{OPE}$ at time T01.

Referring to FIGS. 8, 9 and 10, the master controller 910 issues the master output port enable signal $S_{OPE}$ in response to the falling edge of the master output clock signal $S_{TCK}$ following time T00. This is illustrated for the master output port enable signal $S_{OPEQ}$ by an arrow 1010 between times T00 and T01. Thus, the master output port enable signal $S_{OPE}$ has stabilized by the time the master output clock signal $S_{TCK}$ presents a subsequent falling edge following time T01. Assuming that slave device 304-1 is the target device (based on a previous selection made by virtue of a read command received from the master device 882), it is the only device to be responsive to a received output port enable signal. Therefore, slave device 304-0 does not respond to the output port enable signal $S_{OPE\text{-}0}$ and just forwards both it and the input information signal $S_{SIP\text{-}0}$ to the OPEQ-0 and SOP-0 ports, respectively, with $T_{IOL\text{-}0}=3$ clock cycles of latency.

Slave device 304-1 detects activation of the output port enable signal $S_{OPE\text{-}1}$ following time T04 and is responsive thereto. It, then, starts producing response data through its SOP-1 port. The response data is stabilized by the time the input clock signal $S_{RCK\text{-}1}$ presents a next falling edge following time T05. From this point, valid response data from slave device 304-1 flows through the SIP-j and SOP-j ports of the remaining slave devices synchronized with the master output clock signal $S_{TCK}$ and the output port enable and echo signals ($S_{OPE\text{-}j}$ and $S_{OPEQ\text{-}j}$) as shown in FIG. 10.

The data receiver 912, then, receives the master serial input information signal $S_{SIP}$ (which corresponds to the serial output information signal $S_{SOP\text{-}3}$) from the last slave device 304-3 in the serial interconnection. The signal $S_{SIP}$ contains valid response data if sampled starting at time T08, i.e., after a total of $T_{IOL\text{-}TOTAL}=7$ clock cycles in this example. In parallel, the data receiver 912 receives the master echo signal $S_{OPEQ}$ from the last slave device 304-3, which is the same as the master output port enable signal $S_{OPE}$ but is delayed by seven clock cycles in this example.

The master echo signal (and hence the intermediate echo signal $S_{OPEQ\_INT}$) is delayed relative to the master output port enable signal $S_{OPE}$ by the same total flow-through latency $T_{IOL\_TOTAL}$. Also, the response data contained in the master serial input information signal $S_{SIP}$ is delayed. Thus, the acquisition instant established by the first falling edge in the latch clock signal $S_{CLK\_LAT}$ at the output of the logical AND gate 940 correctly signals the onset of valid data in the intermediate signal $S_{SIP\_INT}$ (which is a slightly delayed version of the master serial input information signal $S_{SIP}$). Moreover, any changes in total flow-through latency $T_{IOL\_TOTAL}$ due to changes in the operating properties of the individual slave devices 304-0 - - - 3 are transparent to the system 802 due to the master echo signal $S_{OPEQ}$ being fed back from the last slave device 304-3 in the serial interconnection.

The activation and deactivation of the propagated master echo signal $S_{OPEQ}$ are delayed from those of the master serial output port enable signal $S_{OPE}$ by the total flow-through latency $T_{IOL\text{-}TOTAL}$. In response to the activation and deactivation of the master echo signal $S_{OPEQ}$, the AND gate 940 outputs clock pulses in the latch clock signal $S_{CLK\_LAT}$ during a latch period $T_{LATCH2}$, as shown in FIG. 10. Therefore, the first to last valid response data contained in $S_{SIP\_INT}$ is sequentially latched by the D-FF 930.

The circuit of FIG. 9 is just an example. Any modifications and variations of the circuit of FIG. 9 to achieve the desired functionality are considered to be within the scope of the present invention and modifications are possible. For example, the AND gate 940 introduces a delay which, although negligible at some operating frequencies, may require compensation at other operating frequencies in order to ensure accuracy at each acquisition instant. To this end, a compensation buffer (not shown) may be inserted in the path of the intermediate signal $S_{SIP\_INT}$ in order to cause the signal at the data input of the D-FF 930 to be properly aligned relative to the acquisition instants established by the latch clock signal $S_{CLK\_LAT}$. Still other modifications and variations are possible.

If, for example, the master output port enable signal $S_{OPE}$ references the rising edge of the master output clock signal $S_{TCK}$ instead of its falling edge, the maximum operating frequency of the system 802 will be increased. However, as a design consideration, one needs to ensure that this does not result in an initial overlap situation between detected activation of the master echo signal $S_{OPEQ}$ and the falling edge of the previous pulse in the master output clock signal $S_{TCK}$. Such overlap situation may generate an unexpected internal short pulse on the latch clock signal $S_{CLK\_LAT}$, possibly resulting in a malfunction. Still other modifications and variations of the system 802 are possible.

The D-FF 930 is one example of latching circuitry. It would be apparent to those skilled in the art that there are numerous alternatives to achieve such a latching function.

In the above embodiment systems, the clocks are provided to the devices in the serial interconnection by a common clock fashion. Thus, the master output clock signal $S_{TCK}$ is to split into the various input clock signals $S_{RCK\text{-}0}$, $S_{RCK\text{-}1}$, $S_{RCK\text{-}2}$ and $S_{RCK\text{-}3}$ to commonly supply it to the series-connected devices. It is, however, possible of providing serially transferred clocks. In such a case, the master clock output signal $S_{TCK}$ is supplied to the first device in the serial interconnection, then is passed from one device to another until it reaches the last device in the serial interconnection. The use of the serially transferred clocks can be useful when designing to overcome power limitations due to fanout that are inherent to the common clock fashion.

Figure 11:
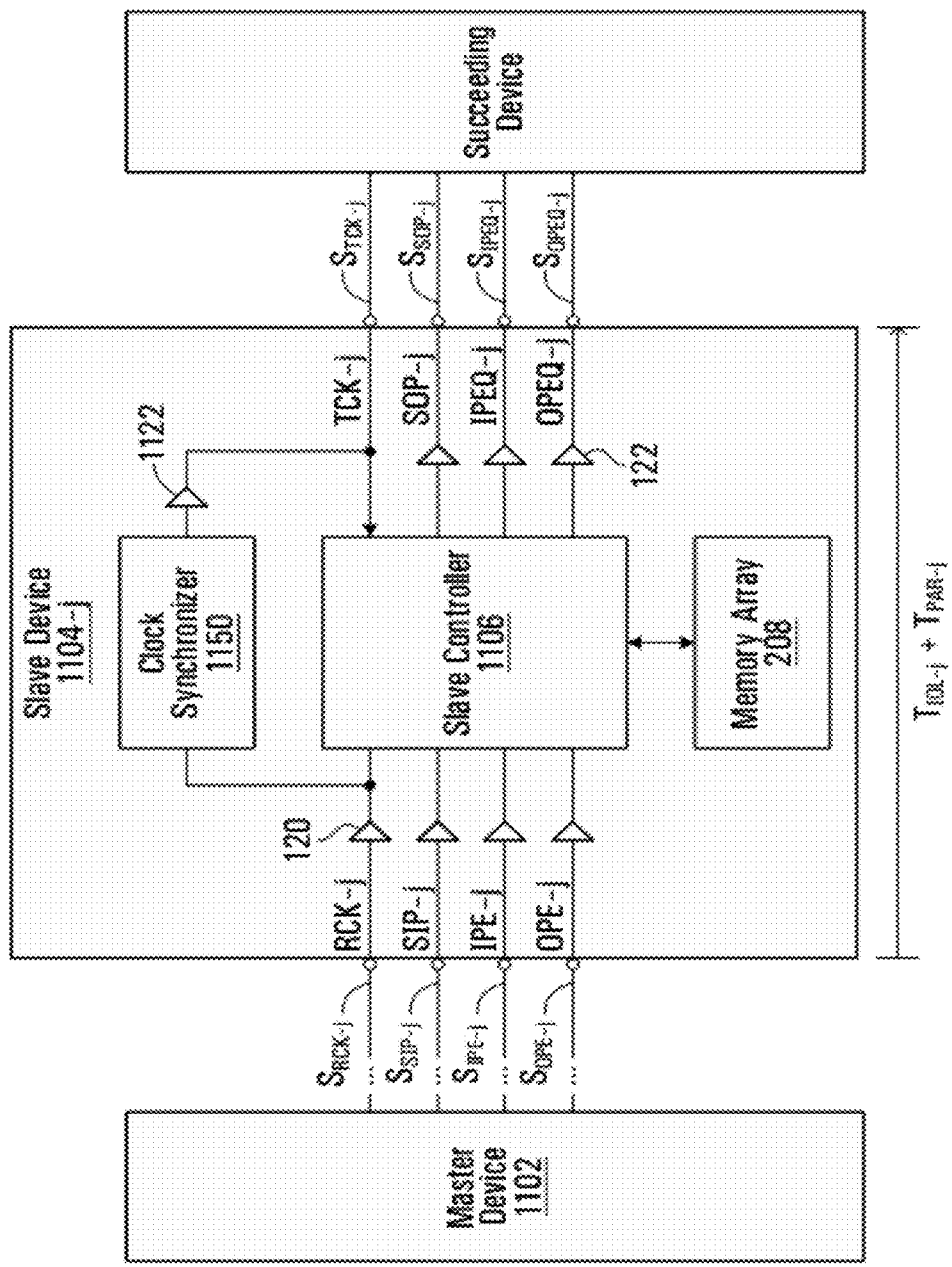
FIG. 11 is a block diagram showing details of another example of one of the slave devices in FIG. 1A.

FIG. 11 shows another example of one of the slave devices in FIG. 1A. The device is used in the serial interconnection wherein clocks are provided by a transfer clock fashion. Referring to FIG. 11, a slave device 1104-$j$ operates with clocks provided by a clock transfer fashion. The slave device 1104-$j$ is similar to slave device 104-$j$ of FIG. 1B. The device 1104-$j$ includes the RCK-j port for receiving the input clock signal $S_{RCK\text{-}j}$ from the master device 1102 (either directly or via another slave device in the serial interconnection). Additionally, the device 1104-$j$ includes a clock output port (hereinafter the "TCK-j port") for supplying a processed version of the input clock signal (hereinafter the output clock signal $S_{TCK\text{-}j}$) to a succeeding slave device in the serial interconnection (or to the master device 1102). Furthermore, the device 1104-$j$ includes a clock synchronizer 1150 that receives an output of one of the input buffers 120.

The output clock signal $S_{TCK\text{-}j}$ originates from the clock synchronizer 1150 that processes the input clock signal $S_{RCK\text{-}j}$ passed through a corresponding one of the input buffers 120. The clock synchronizer 1150 includes, for example, a phase-locked loop (PLL), a delay-locked loop (DLL) or a variant thereof. An additional output buffer 1122 analogous to output buffers 122 is shown connected to the TCK-j port for receiving an output of the clock synchronizer 1150. Examples of the clock synchronizer 1150 are described in U.S. Provisional Patent Application No. 60/894,246, filed Mar. 12, 2007.

Also, slave device 1104-j comprises a memory array 208 and a slave controller 1106, which is similar to the slave controller 106 (see FIG. 1B) previously described. The slave controller 1106 receives the input clock signal $S_{RCK-j}$ through the input buffer 120 and the signals input to the slave controller 1106 are synchronized with the input clock signal $S_{RCK-j}$. Also, the slave controller 1106 receives the output clock signal $S_{TCK-j}$ from the clock synchronizer 1150 through one of the output buffers 1122. The signals output by the slave controller 1106 are synchronized with the output clock signal $S_{TCK-j}$. Therefore, the transfer of the signals from slave device 1104-j to the succeeding device in the serial interconnection is synchronized with the output clock signal $S_{TCK-j}$.

It should be appreciated that when the master output clock signal $S_{TCK}$ is provided by a clock transfer fashion, the flow-through latency of a particular slave device (such as slave device 1104-j) is no longer measured in units of clock cycles, but acquires a range of possible values, depending on the design of the particular slave device. For notational convenience, the flow-through latency of slave device 1104-j is expressed as $T_{IOL-j}+T_{PAR-j}$, where $T_{IOL-j}$ is as before (in terms of clock cycles of latency) and $T_{PAR-j}$ is the parasitic delay expressed either in units of time (e.g., picoseconds). In these instances, the flow-through latency of slave device 1104-j is very difficult to predict due to the parasitic delay $T_{PAR-j}$, and therefore when it is of interest to ascertain when the output information signal $S_{SOP-3}$ carries valid data, then it is advantageous to use a modified version of the feedback ring type interconnection shown in FIGS. 8-10. Such an advantageous modified version of a feedback ring type interconnection will be described below.

Figure 12:
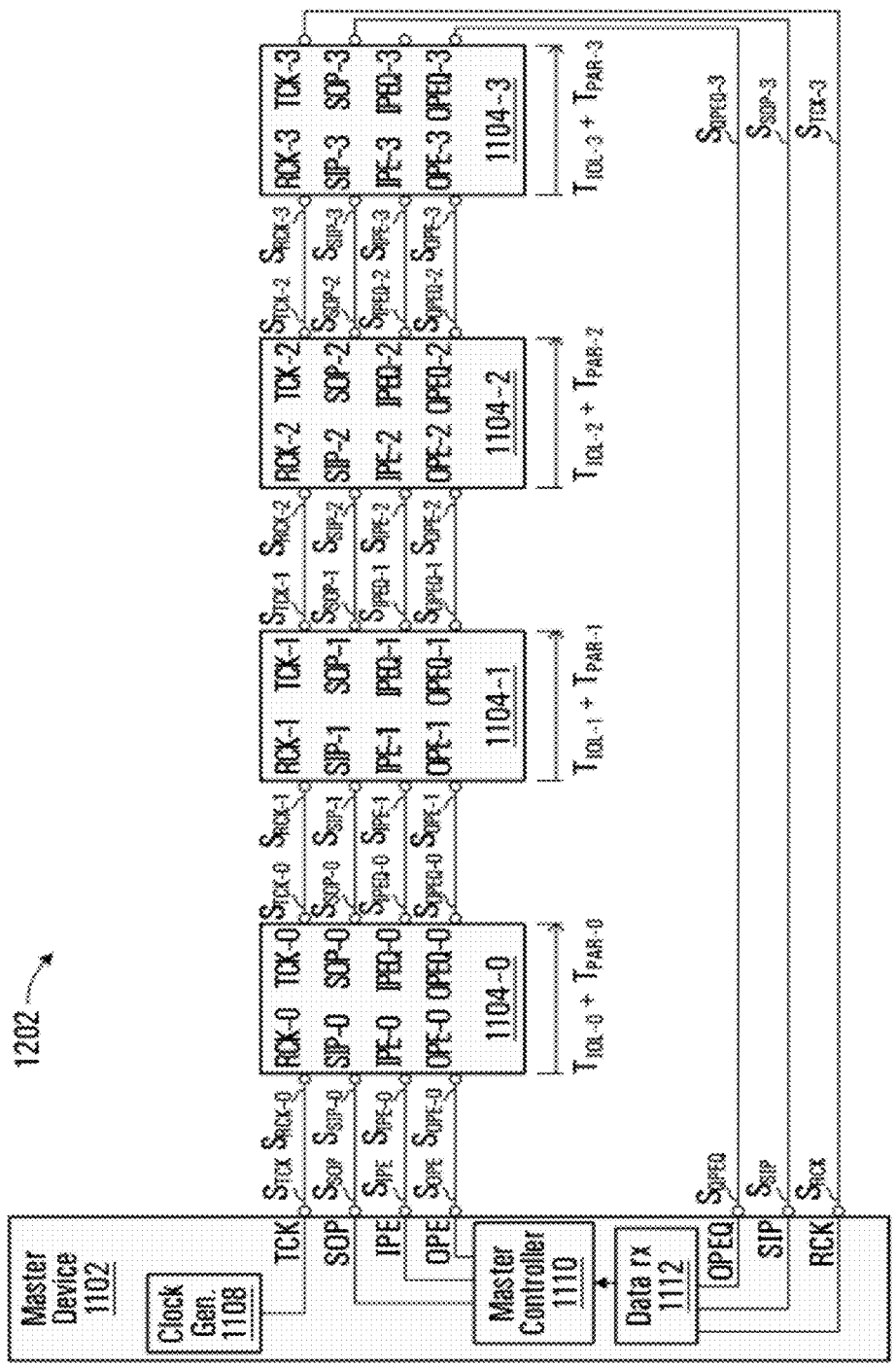
FIG. 12 is a block diagram showing a system according to another embodiment of the present invention, the system including a master device and a serial interconnection of four slave devices shown in FIG. 11, wherein clocks are provided in a clock transfer fashion.

FIG. 12 shows a system according to another embodiment of the present invention, the system including a controller and a serial interconnection of a plurality of devices wherein clocks are provided in a clock transfer fashion. Referring to FIG. 12, a system 1202 includes a master device 1102 and a serial interconnection of slave devices 1104-0 - - - 3. While in the present example there are four slave devices 1104-0 - - - 3, it would be apparent to those of ordinary skill in the art that the system 1202 may include any number of slave devices.

The configuration of the master device 1102 is similar to that of the master device 882 of FIG. 8. Each of the slave devices 1104-0 - - - 3 is configured as shown in FIG. 11.

The master device 1102 has an interface comprising a plurality of output ports for providing a group of signals to a first slave device 1104-0 of the serial interconnection. The interface of the master device 1102 includes a master clock output port (hereinafter, the "TCK port") over which is output a master output clock signal $S_{TCK}$, a master serial output port (hereinafter, the "SOP port") over which is provided a master serial output information signal $S_{SOP}$, a master serial input port enable output port (hereinafter, the "IPE port") over which is provided a master serial input port enable signal $S_{IPE}$, and a master serial output port enable output port (hereinafter, the "OPE port") over which is provided a master serial output port enable signal $S_{OPE}$.

The interface of the master device 1102 may further includes various other output ports over which can be provided the chip select signal, the reset signal and various other control and data information destined for the slave devices 1104-0 - - - 3.

The master device 1102 further includes a master serial input port (hereinafter, the "SIP port") over which is received a master serial input information signal $S_{SIP}$ from the last slave device 1104-3 of the serial interconnection.

The interface of the master device 1102 further includes a master output port enable echo input port (hereinafter, the "OPEQ" port) over which is received a master echo signal $S_{OPEQ}$ from the last slave device 1104-3 of the serial interconnection.

In addition, the interface of the master device 1102 further includes a master clock input port (hereinafter, the "RCK port") over which is received a master input clock signal $S_{RCK}$ from the last slave device 1104-3 of the serial interconnection.

The output ports of the master device 1102 in the system 1202 (i.e., the SOP, IPE and OPE ports) are connected to the input ports of the first slave device 1104-0 (i.e., the SIP-0, IPE-0 and OPE-0 ports, respectively), whose output ports (i.e., the SOP-0, IPEQ-0 and OPEQ-0 ports) are connected to the input ports of the second slave device 1104-1 (i.e., the SIP-1, IPE-1 and OPE-1 ports, respectively). Similarly, the output ports of slave device 1104-1 (i.e., the SOP-1, IPEQ-1 and OPEQ-1 ports) are connected to the input ports of the third slave device 1104-2 (i.e., the SIP-2, IPE-2 and OPE-2 ports, respectively), whose output ports (i.e., the SOP-2, IPEQ-2 and OPEQ-2 ports) are connected to the input ports of the fourth and last slave device 1104-3 (i.e., the SIP-3, IPE-3 and OPE-3 ports, respectively).

The SOP-3 and OPEQ-3 ports of slave device 1104-3 are connected to the SIP and OPEQ ports of the master device 1102. The SOP-3 to SIP connection allows delivery of the master serial input information signal $S_{SIP}$ to the master device 1102. The OPEQ-3 to OPEQ connection allows delivery of the master echo signal $S_{OPEQ}$ to the master device 1102. Here again, the IPEQ-3 port of slave device 1104-3 does not need to be connected to the master device 1102.

In the system 1202 utilizing the clock transfer fashion shown in FIG. 12, the TCK port of the master device 1102 is connected to the RCK-0 port of the first slave device 1104-0, whose TCK-0 port is connected to the RCK-1 port of the second slave device 1104-1. Similarly, the TCK-1 port of slave device 1104-1 is connected to the RCK-2 port of the third slave device 1104-2, whose TCK-2 port is connected to the RCK-3 port of the fourth (the last) slave device 1104-3. The TCK-3 port of the fourth slave device 1104-3 is connected to the RCK port of the master device 1102.

Referring to FIGS. 11 and 12, the master device 1102 generates the master output clock signal $S_{TCK}$, which is sent out to the first slave device 1104-0 over the TCK port. The signal $S_{TCK}$ reaches the RCK-0 port of the slave device 1104-0, in the form of the input clock signal $S_{RCK-0}$ and provided to the slave controller 1106 and the clock synchronizer 1150. The input clock signal $S_{RCK-0}$ is processed by the clock synchronizer 1150 and the output clock signal $S_{TCK-0}$ is provided via the TCK-0 port of the device 1104-0. This clock distribution by the clock transfer fashion continues until the output clock signal $S_{TCK-3}$ is output by the fourth (i.e., last) slave device 1104-3 to the master device 1102. The signal $S_{TCK-3}$ is output over the TCK-3 port thereof and is received as the master input clock signal $S_{RCK}$ by the RCK port of the master device 1102. Thus, the master input clock signal $S_{RCK}$ is a propagated version of the master output clock signal $S_{TCK}$ re-synchronized by the clock synchronizer 1150 in each of the slave devices 1104-0 - - - 3.

The master device 1102 is now described in greater detail. In the particular example, the master device 1102 includes a clock generator 1108, a master controller 1110 and a data receiver 1112. The clock generator 1108, which is identical to the clock generator 908 of FIG. 8, generates the master output clock signal $S_{TCK}$, which is supplied to slave device 1104-0. The master controller 1110, which can be identical to the master controller 910 of FIG. 8, issues commands, activates the master input port enable signal $S_{IRE}$ and the master output port enable signal $S_{OPE}$ at the appropriate instants. The signals output by the master controller 1110 are timed, so that the intended acquisition instants are aligned with the rising edges of clock pulses of the master output clock signal $S_{TCK}$. The data receiver 1112 accepts responses provided by the slave devices 1104-0 - - - 3 in the serial interconnection.

The function of the master controller 1110 is similar to that of the master controllers 610 and 910 of FIGS. 5 and 8. The master controller 1110 is operative to issue an access command for a "target" device. The target device may be the first slave device 1104-0 or any other of the slave devices 1104-1, 1104-2, 1104-3 in the serial interconnection. For notational convenience, the target device is denoted 1104-t, where $0 \leq t \leq 3$. The master controller 1110 also ensures that the master serial output information signal $S_{SOP}$ is aligned with the master serial input port enable signal $S_{IPE}$. Thus, the first slave device 1104-0 receives the serial input information signal $S_{SIP-0}$ containing the command string including an access command at its SIP-0 port. The master input port enable signal is received by the first slave device 1104-0 at its IPE-0 port in the form of the input port enable signal $S_{IPE-0}$.

Where the access command is a read command, the master output port enable signal $S_{OPE}$ is also activated after the issuance of the first, second and third bytes of the command string. The master output port enable signal $S_{OPE}$ is kept activated for a suitable length of time commensurate with the amount of response data expected from the target device 11044. The master serial output port enable signal $S_{OPE}$ is, thus, received by the first slave device 1104-0 at the its OPE-0 port in the form of the output port enable signal $S_{OPE-0}$.

Upon receipt of the command by the first slave device 1104-0 at its SIP-0 port, the slave controller 1106 in the first slave device 1104-0 determines whether the first slave device 1104-0 is the target device 11044. This can be done by verifying the device address specified in the first byte of the command string. In the case where the first slave device 1104-0 is the target device 1104-t, the slave controller 1106 interprets the remaining second and third bytes of the command string. Then, the first slave device 1104-0 (i.e., the target device 1104-t) operates in accordance with the instructions identified by the second and third bytes of the command string. In the specific case of the read command, the slave controller 1106 in the first slave device 1104-0 produces read data by accessing the contents of one or more specified locations reads in the memory array 208. The slave controller 1106, then, waits for the output port enable signal $S_{OPE-0}$ to be activated before placing the read data onto the SOP-0 port after another $T_{IOL-0}$ clock cycles+$T_{PAR-0}$ picoseconds.

Additionally, the slave controller 1106 transfers the signals appearing at the IPE-0 and OPE-0 ports onto the IPEQ-0 and OPEQ-0 ports, respectively, after $T_{IOL-0}$ clock cycles+$T_{PAR-0}$ picoseconds.

If the first slave device 1104-0 is not the target device 1104-t, the slave controller 1106 in the first slave device 1104-0 simply re-transmits the received serial information towards the next slave device 1104-1. That is, the slave controller 1106 transfers the serial information received via the SIP-0 port onto the SOP-0 port after $T_{IOL}$ clock cycles. Additionally, as already described, the slave controller 1106 transfers the signals appearing at the IPE-0 and OPE-0 ports onto the IPEQ-0 and OPEQ-0 ports, respectively, after $T_{IOL-0}$ clock cycles+$T_{PAR-0}$ picoseconds.

It should be noted that the operations of the slave controller 1106 are driven by rising and/or falling edges in the input clock signal $S_{RCK-0}$. The input clock signal $S_{RCK-0}$ is output by the master device 1102 as the master output clock signal $S_{TCK}$ and received via the RCK-0 port of slave device 1104-0. The input clock signal $S_{RCK-0}$ is used to control operation of the clock synchronizer 1150, which strives to produce the output clock signal $S_{TCK-0}$ synchronized with the input clock signal $S_{RCK-0}$. Thus, the output clock signal $S_{TCK-0}$ is provided to the second slave device 1104-1, the operations of which are synchronized with the echo signals $S_{IPEQ-0}$, $S_{OPEQ-0}$ and the output information signal $S_{SOP-0}$. The output clock signal $S_{TCK-0}$ is a propagated version of the master output clock signal $S_{TCK}$.

The same basic operations are performed at each of the succeeding slave devices 1104-1, 1104-2 and 1104-3. It should be noted that at some point, the information appearing on the SOP-t port (i.e., the SOP-j port of the given one of the slave devices 1104-0 - - - 3 that is the target device 1104-t) contains response data that is destined for the master device 1102. The response data continues to be propagated until it is transmitted in the form of the serial output information signal $S_{SOP-3}$ by the last slave device 1104-3 via its SOP-3 port. The serial output information signal $S_{SOP-3}$ containing the response data is received at the SIP port of the master device 1102 in the form of the master serial input information signal $S_{SIP}$. Similarly, the master output clock signal continues to be propagated until it is transmitted in the form of the output clock signal $S_{TCK-3}$ by the last slave device 1104-3 via its TCK-3 port. The output clock signal $S_{TCK-3}$ is received at the RCK port of the master device 1102 in the form of the master input clock signal $S_{RCK}$.

As can be appreciated from the above description, the master device 1102 issues a read command to control the behavior of the target device 1104-t in the serial interconnection by using the SIP, IPE and OPE ports. The target device 11044, then, responds to the instructions from the master device 1102 and transmits read data further along the serial interconnection. The read data (i.e., the response data) is released by the target device 1104-t, after the target device 11044 detects activation of the output port enable signal (i.e., $S_{OPE-t}$). The signal $S_{OPE-t}$ is a version of the master output port enable signal $S_{OPE}$ that is delayed by $T_{IOL-j}$ clock cycles+$T_{PAR-j}$ picoseconds at each preceding slave device in the serial interconnection (i.e., for j<t). The release of the response data by the target device 1104-t is delayed relative to activation of the master output port enable signal $S_{OPE}$ by the sum (or total) of the flow-through latencies of all device up to and including the target device 1104-t. Thereafter, the response data undergoes a further delay of $T_{IOL-j}$ clock cycles+$T_{PAR-j}$ picoseconds at each succeeding device in the serial interconnection (i.e., for j>t). Thus, the response data appearing in the master serial input information signal $S_{SIP}$ is delayed relative to activation of the master output port enable signal $S_{OPE}$ by a total flow-through latency of the serial interconnection, denoted $T_{IOL-TOTAL}$, where $T_{IOL-TOTAL} = \Sigma_j T_{IOL-j}$ clock cycles+$\Sigma_j T_{PAR-j}$ picoseconds.

Meanwhile, the master input clock signal $S_{RCK}$ is a version of the master output clock signal $S_{TCK}$ that is re-synchronized at, and propagated by, each of the devices in the serial interconnection. Because of the periodicity of the clock signal being propagated, the mis-alignment between the master input clock signal $S_{RCK}$ and the master output clock signal $S_{TCK}$ manifests itself only as the total parasitic delay of $\Sigma_j T_{PAR-j}$ picoseconds.

The master device 1102 begins to receive the response data via its SIP port at a time instant that is delayed relative to activation of the master output port enable signal $S_{OPE}$ by $T_{IOL-TOTAL}$. As described above with reference to FIGS. 8-10, this time instant may not apparent from the content of the master serial input information signal $S_{SIP}$ itself, but is apparent from the master echo signal $S_{OPEQ}$. In the particular example, the master echo signal $S_{OPEQ}$ is a propagated version of the master output port enable signal $S_{OPE}$. It has undergone the same delay as the master serial input information signal $S_{SIP}$, corresponding to the total flow-through latency $T_{IOL-TOTAL}$. Thus, processing of the master echo signal $S_{OPEQ}$ can permit the master device 1102 to extract valid data from the master serial input information signal $S_{SIP}$. The total flow-through latency $T_{IOL-TOTAL}$ includes a cumulative parasitic delay $\Sigma_j T_{PAR-j}$ picoseconds induced by the slave devices 1104-0 - - - 3. The $T_{IOL-TOTAL}$ is not a whole number of clock cycles. It is, therefore, advantageous to use the master input clock signal $S_{RCK}$ for the purposes of establishing acquisition instants, because it takes into account this parasitic delay.

Figure 13:
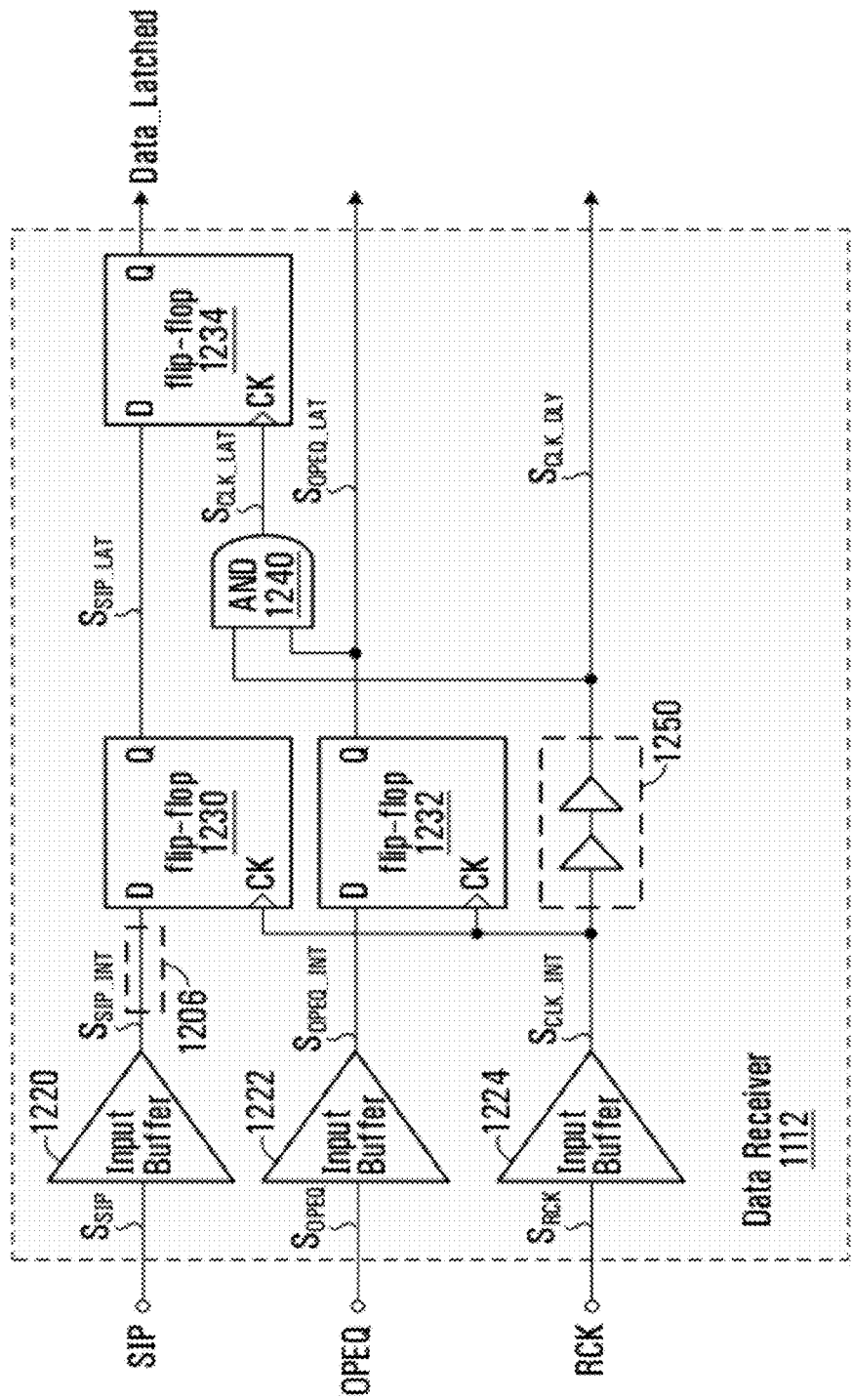
FIG. 13 is a block diagram showing details of a data receiver used by the master device in the system of FIG. 12.

FIG. 13 shows details of the data receiver of FIG. 12. Referring to FIG. 13, the data receiver 1112 includes a first input buffer 1220, a second input buffer 1222, a third input buffer 1224, a first D-FF 1230, a second D-FF 1232, a third D-FF 1234, an AND gate 1240 and a delay element 1250.

The first input buffer 1220 receives the master serial input information signal $S_{SIP}$ arriving at the SIP port of the master device 1102. The first input buffer 1220 outputs an intermediate signal $S_{SIP\_INT}$, which is fed to a data input (D) of the first D-FF 1230. The intermediate signal $S_{SIP\_INT}$ is, thus, a slightly delayed version of the master serial input information signal $S_{SIP}$.

The second input buffer 1222 receives the master echo signal $S_{OPEQ}$ arriving at the OPEQ port of the master device 1102. The second input buffer 1222 outputs an intermediate echo signal $S_{OPEQ\_INT}$, which is fed to a data input (D) of the second D-FF 1232. The intermediate echo signal $S_{OPEQ\_INT}$ is, thus, a slightly delayed version of the master echo signal $S_{OPEQ}$.

The third input buffer 1224 receives the master input clock signal $S_{RCK}$ arriving at the RCK port of the master device 1102. The third input buffer 1224 outputs an intermediate clock signal $S_{CLK\_INT}$, which is fed to the clock inputs CK of the first and second D-FFs 1230 and 1232 and the delay element 1250. The intermediate clock signal $S_{CLK\_INT}$ is a slightly delayed version of the master input clock signal $S_{RCK}$.

The first D-FF 1230 operates to transfer the signal at its data input (i.e., the intermediate signal $S_{SIP\_INT}$) onto a data output (Q) in dependence upon the intermediate clock signal $S_{CLK\_INT}$. A latched output signal $S_{SIP\_LAT}$ is provided from the data output of the D-FF 1230. Similarly, the second D-FF 1232 operates to transfer the signal at its data input (i.e., the intermediate echo signal $S_{OPEQ\_INT}$) onto a data output (Q) in dependence upon the intermediate clock signal $S_{CLK\_INT}$. The D-FF 1232 provides a latched echo signal $S_{OPEQ\_LAT}$ of the echo signal $S_{OPEQ-j}$ to the succeeding device.

The delay element 1250 delays the intermediate clock signal $S_{CLK\_INT}$ with a predetermined time and provides a delayed clock signal $S_{CLK\_DLY}$. The AND gate 1240 performs a logical AND operation on the latched echo signal $S_{OPEQ\_LAT}$ and the delayed clock signal $S_{CLK\_DLY}$. An AND logic output signal is provided as a latch clock signal $S_{CLK\_LAT}$ to the clock input CK of the third D-FF 1234.

The latched output signal $S_{SIP\_LAT}$ from the first D-FF 1230 is fed to a data input (D) of the third D-FF 1234. The third D-FF 1234 operates to transfer the signal at its data input (D) onto a data output (Q) in dependence upon the latch clock signal $S_{CLK\_LAT}$.

The latch clock signal $S_{CLK\_LAT}$ is the result of the AND logic operation of a suitably delayed version of the master input clock signal $S_{RCK}$ and the intermediate echo signal $S_{OPEQ\_INT}$. The delay element 1250 can apply a delay that is adjustable depending on variations in process, temperature and/or power supply level. The delay element 1250 serves to avoid timing glitches on the signal at the latch clock signal $S_{CLK\_LAT}$. In one example, the delay element 1250 is designed to apply approximately the same delay as the set-up and hold time of the second D-FF, so that the signals at the two inputs of the AND gate 1240 are aligned with one another (i.e., the latched echo signal $S_{OPEQ\_LAT}$ and the delayed clock signal $S_{CLK\_DLY}$).

The master echo signal $S_{OPEQ}$ (and hence the intermediate echo signal $S_{OPEQ\_INT}$) is delayed relative to the master output port enable signal $S_{OPE}$ by the total flow-through latency $T_{IOL\_TOTAL}$ including the total parasitic delay of $\Sigma_j T_{PAR-j}$. It means that the third D-FF 1234 only begins transferring the data at its data input (i.e., the data carried by the intermediate signal $S_{SIP\_INT}$) to its data output after a delay of $T_{IOL-TOTAL}$ clock cycles following activation of the master output port enable signal $S_{OPE}$. Recalling that this is the same delay experienced by the response data present in the master serial input information signal $S_{SIP}$ (or the slightly delayed intermediate signal $S_{SIP\_INT}$) relative to activation of the master output port enable signal $S_{OPE}$, it will become apparent that activation of the latch clock signal $S_{CLK\_LAT}$ will correspond to the onset of a time window during which the master serial input information signal $S_{SIP}$ (or the slightly delayed intermediate signal $S_{SIP\_INT}$) is known to validly carry data output by the target device via the last slave device 1104-3 or just the target device if it is itself the last slave device in the serial interconnection. Moreover, the fact that the master received clock signal $S_{RCK}$ (or the delayed intermediate clock signal $S_{CLK\_INT}$) takes into account the parasitic delay $\Sigma_j T_{PAR-j}$ introduced by the slave devices 1104-0 - - - 3 allows the acquisition instants established by the latch clock signal $S_{CLK\_LAT}$ to be properly aligned, without sacrificing set-up or hold time margins. Thus, the contents of the intermediate signal $S_{SIP\_INT}$ latched by the circuitry of the master device 1102 allow timely capture of the response data that is actually sent by the target device.

The activation and deactivation of the latched echo signal $S_{OPEQ\_LAT}$ are delayed from those of the master serial output port enable signal $S_{OPE}$. An amount of the delay includes the total flow-through latency $T_{IOL-TOTAL}$ and the total parasitic delay of $\Sigma_j T_{PAR-j}$. In response to the latch clock signal $S_{CLK\_LAT}$, the D-FF 1234 latches the first to last valid response data contained in the latched output signal $S_{SIP\_LAT}$ sequentially during a latch period $T_{LATCH3}$, as shown in FIG. 14B. The latched data "Data_Latched", the latched echo signal $S_{OPEQ\_LAT}$ and the delayed clock signal $S_{CLK\_DLY}$ are provided to the master controller 1110 of the master device 1102.

Thus, the clock distribution by a clock transfer fashion is used to overcome fanout limitations and while the parasitic delays, that may be incurred, can be neutralized.

Figure 14A:
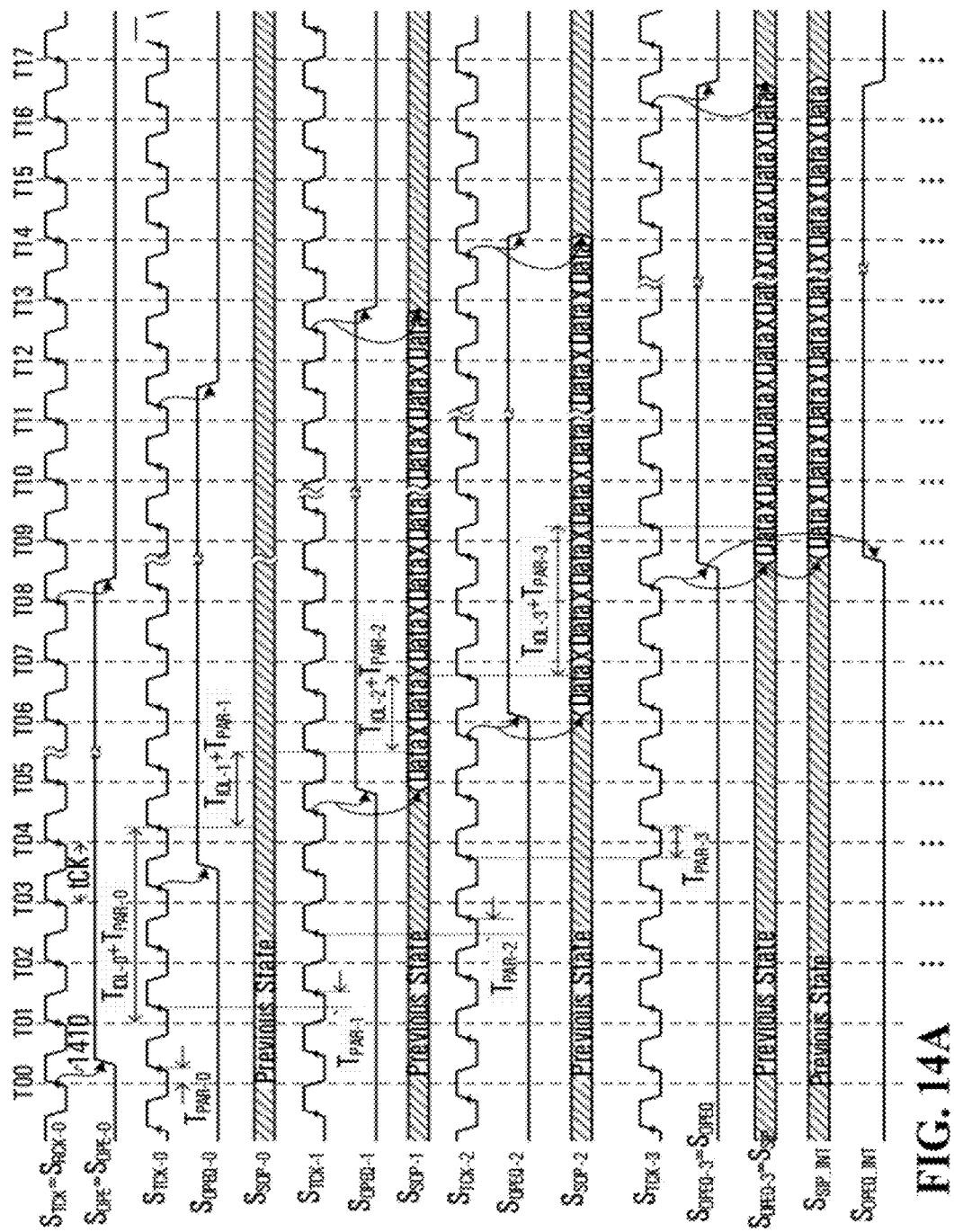
FIGS. 14A and 14B are timing diagrams illustrating the behaviour of various signals exchanged among the master device and the slave devices in the system of FIG. 12.
Figure 14B:
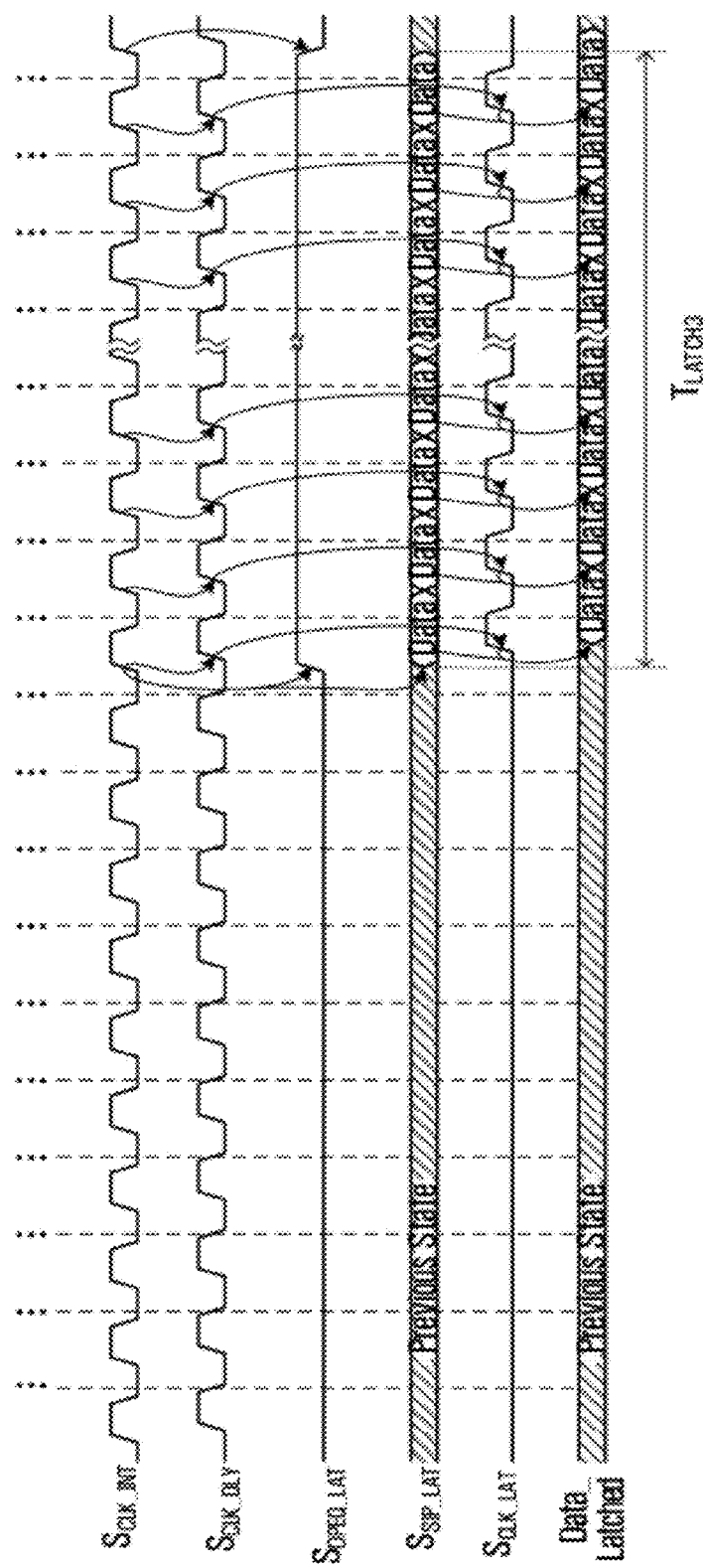

FIGS. 14A and 14B show the behaviour of various signals in FIGS. 12 and 13, the signals including the input clock signals $S_{RCK-0}$ (equivalent to the master output clock signal $S_{TCK}$), $S_{RCK-1}$, $S_{RCK-2}$, $S_{RCK-3}$, the output clock signals $S_{TCK-0}$, $S_{TCK-1}$, $S_{TCK-2}$, $S_{TCK-3}$ (equivalent to the master input clock signal $S_{RCK}$), the master output port enable signal $S_{OPE}$ (equivalent to the output port enable signal $S_{OPE-0}$), the echo signals $S_{OPEQ-0}$, $S_{OPEQ-1}$, $S_{OPEQ-2}$ and $S_{OPEQ-3}$ (equivalent to the master echo signal $S_{OPEQ}$), the output information signals $S_{SOP-0}$, $S_{SOP-1}$, $S_{SOP-2}$ and $S_{SOP-3}$ (equivalent to the master serial input information signal $S_{SIP}$), the intermediate signal $S_{SIP\_INT}$, the intermediate echo signal $S_{OPEQ\_INT}$, the intermediate clock signal $S_{CLK\_INT}$, the clock signal $S_{CLK\_LAT}$, the output of the delay element 1250 and the latched data at the latch data outputs of the first, second and third D-FF 1230, 1232, 1234. In this case, it is seen that the target device 1104-*t* is slave device 1104-1, as evidenced by the first appearance of response data on the output information signal $S_{SOP-1}$ following time T04, namely $T_{IOL-0}$=3 clock cycles+$T_{PAR-0}$ picoseconds following the activation of the master output port enable signal $S_{OPE}$ at time T01.

Referring to FIGS. 12, 13, 14A and 14B, the master controller 1110 issues the master output port enable signal $S_{OPE}$ in response to the rising edge of the master input clock signal $S_{RCK}$ at time T01. This is illustrated for the master output port enable signal $S_{OPEQ}$ by an arrow 1410 between acquisition instants T00 and T01. Thus, the master output port enable signal $S_{OPE}$ has stabilized by the time the master input clock signal $S_{RCK}$ presents a subsequent rising edge at time T01. Assuming that slave device 1104-1 is the target device (based on a previous selection made by virtue of a read command received from the master device 1102), it is the only device to be responsive to a received output port enable signal. Therefore, slave device 1104-0 does not respond to the output port enable signal $S_{OPE-0}$ and just forwards both it and the input information signal $S_{SIP-0}$ to the OPEQ-0 and SOP-0 ports, respectively, with $T_{IOL-0}$=3 clock cycles+$T_{PAR-0}$ picoseconds of latency, synchronized with the output clock signal $S_{TCK-0}$.

Slave device 1104-1 detects activation of the output port enable signal $S_{OPE-1}$ at time T04+$T_{PAR-0}$ picoseconds and is responsive thereto. It, then, starts producing response data through its SOP-1 port. The response data is stabilized by the time the output clock signal $S_{TCK-1}$ presents a next rising edge at time T05+$T_{PAR-0}$+$T_{PAR-1}$ picoseconds. From this point, valid response data from slave device 1104-1 flows through the SIP-j and SOP-j ports of the remaining slave devices synchronized with the respective output clock signal $S_{TCK-j}$ at each slave device, as shown in FIGS. 14A and 14B.

The data receiver 1112, then, receives the master serial input information signal $S_{SIP}$ (which corresponds to the serial output information signal $S_{SOP-3}$) from the last slave device 1104-3 in the serial interconnection, which signal will contain valid response if sampled starting at time T08+$T_{PAR-0}$+$T_{PAR-1}$+$T_{PAR-2}$+$T_{PAR-3}$ picoseconds, i.e., after a total of $T_{IOL-TOTAL}$=7 clock cycles+$\Sigma_j T_{PAR-j}$ picoseconds in this example. In parallel, the data receiver 1112 receives the master echo signal $S_{OPEQ}$ from the last slave device 1104-3, which is the same as the master output port enable signal $S_{OPE}$ but is delayed by 7 clock cycles+$\Sigma_j T_{PAR-j}$ picoseconds in this example.

The master echo signal (and hence the intermediate echo signal $S_{OPEQ\_INT}$) is delayed relative to the master output port enable signal $S_{OPE}$ by the same total flow-through latency $T_{IOL-TOTAL}$ as the response data contained in the master serial input information signal $S_{SIP}$. The acquisition instant established by the first rising edge in the latch clock signal $S_{CLK\_LAT}$ at the output of the logical AND gate 1240 will correctly signal the onset of valid data in the intermediate signal $S_{SIP\_INT}$ (which is a slightly delayed version of the master serial input information signal $S_{SIP}$). Meanwhile, any parasitic delays in the master serial input information signal $S_{SIP}$ are neutralized by the fact that they are also present in the master input clock signal $S_{RCK}$ from which are established the acquisition instants used to latch the response data in the master serial input information signal $S_{SIP}$. Moreover, any changes in total flow-through latency $T_{IOL-TOTAL}$ due to changes in the operating properties of the individual slave devices 1104-0 - - - 3 are transparent to the system 1202 due to the master echo signal $S_{OPEQ}$ being fed back from the last slave device 1104-3 in the serial interconnection.

The circuit of FIG. 13 is just an example. Any modifications and variations of the circuit of FIG. 13 to achieve the desired functionality are considered to be within the scope of the present invention and modifications are possible. For example, the AND gate 1240 introduces a delay which, although negligible at some operating frequencies, may require compensation at other operating frequencies in order to ensure accuracy at each acquisition instant. To this end, a compensation buffer 1260 (shown in dashed outline) may be inserted in the path of the intermediate signal $S_{SIP\_INT}$ in order to cause the signal at the data input of the first D-FF 1230 to be properly aligned relative to the acquisition instants established by the latch clock signal $S_{CLK\_LAT}$. Still other modifications and variations are possible.

For example, one can simplify the system 1202 by eliminating the delay element 1250. When this is done at sufficiently low operating frequencies of the system 1202, this will not risk resulting in an initial overlap situation between detected activation of the master echo signal $S_{OPEQ}$ and the falling edge of the previous pulse in the master input clock signal $S_{RCK}$ due to spurious pulses on the latch clock signal $S_{CLK\_LAT}$. Another alternative that allows elimination of the delay element is to design the system 1202 to reference the falling edge of the master input clock signal $S_{RCK}$ rather than its rising edge.

The above embodiments have considered circuitry designed such that the acquisition instant established by the rising and/or falling edges of a clock signal are aligned with the data to be captured. That is to say, in the embodiments above, the rising and/or falling edges of the master output clock signal $S_{TCK}$ or the master input clock signal $S_{RCK}$ appear at instants in time when the signal being latched is stable and contains the desired data to be captured. This is known as "center-aligned" clock signal alignment technique. However, it should be understood that the present invention applies without limitation to other clock signal alignment techniques, including "edge-aligned" (or "source-synchronous") clock signal alignment. One example of a system that uses edge-aligned clock signals is now described with reference to FIG. 15, which shows a system 1502 including a master device 1582 and a serial interconnection of slave devices 1504-0 - - - 3. While in the present example there are four slave devices 1504-0 - - - 3, it would be apparent to those of ordinary skill in the art that the system 1502 may include any number of slave devices.

The slave devices 1504-0 - - - 3 are virtually identical to the slave devices 1104-0 - - - 3 described earlier with reference to FIG. 12, except that they are adapted to operate using edge-aligned clock signals. They will not be described in detail here, as the modifications to their structure and operation will be understood to those skilled in the art. For its part, the master device 1582 is virtually identical to the master device 1102 previously described in terms of the way in which it interfaces with the slave devices 1504-0 - - - 3. The only difference in the master device 1582 is in a data receiver 1512, which accepts responses generated by the slave devices 1504-0 - - - 3 in the serial interconnection. The master device 1582 also includes a clock generator 1508 and a master controller 1510 that are similar to the clock generator 1108 and the master controller 1110 of the master device 1102 shown in FIG. 12.

Figure 15:
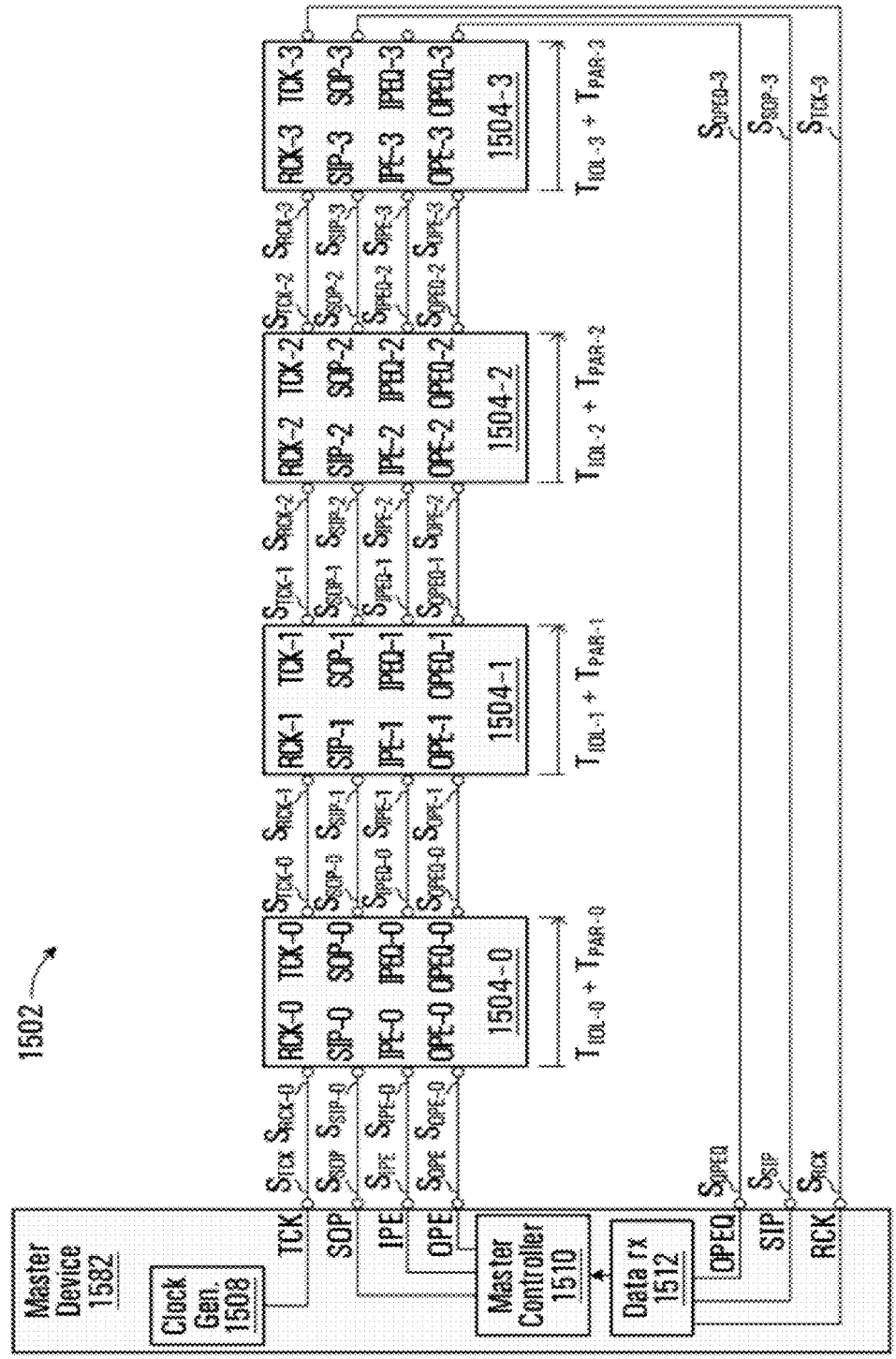
FIG. 15 is a block diagram showing a system according to another embodiment of the present invention, the system being similar to that of FIG. 12, exhibiting edge-aligned clock signal alignment.
Figure 16:
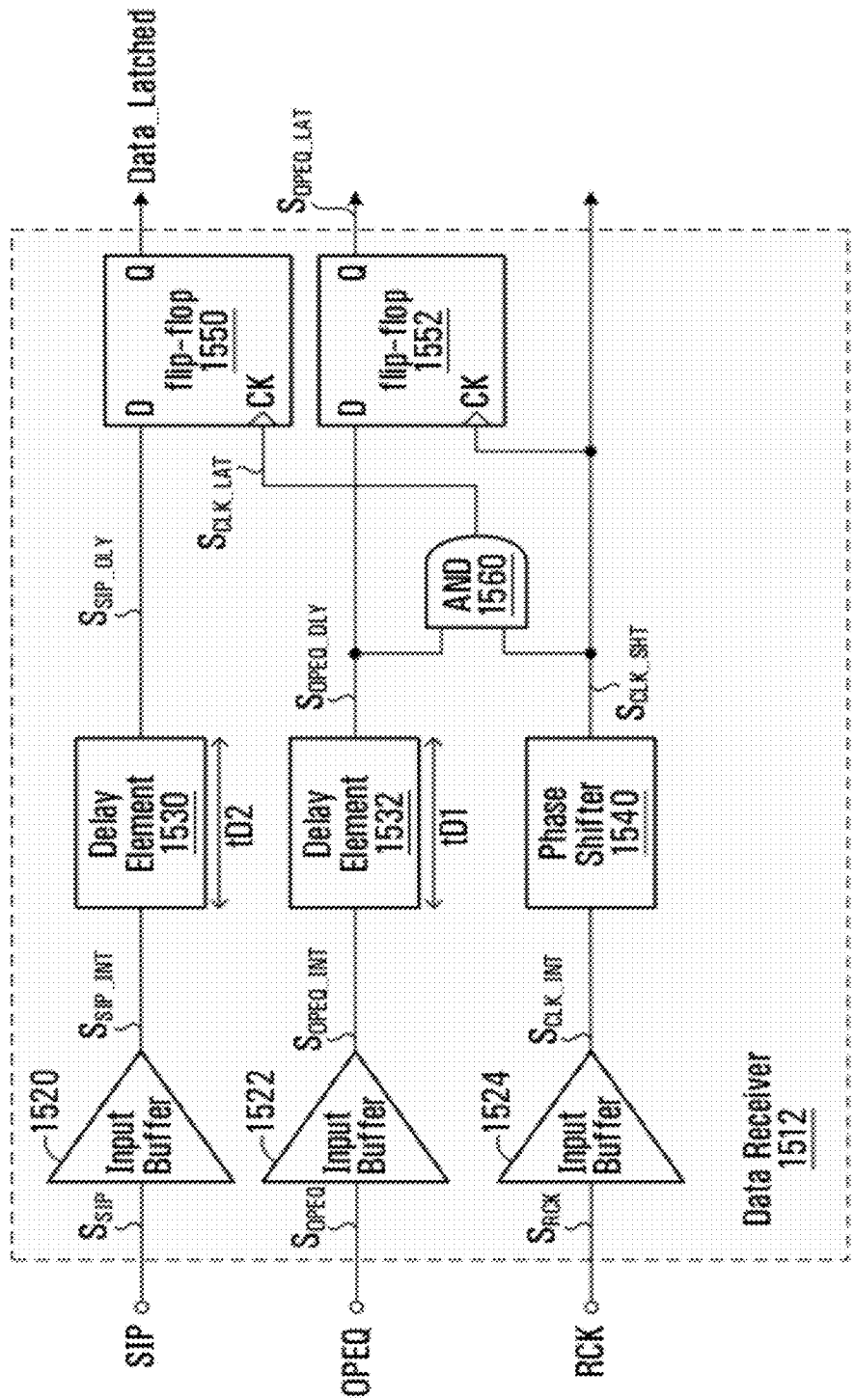
FIG. 16 is a block diagram showing details of a data receiver used by the master device in the system of FIG. 15.

FIG. 16 shows details of the data receiver 1512 of FIG. 15. Referring to FIG. 16, the data receiver 1512 comprises a first input buffer 1520, a second input buffer 1522, a third input buffer 1524, a first delay element 1530, a second delay element 1532, a phase shifter 1540, a first D-FF 1550, a second D-FF 1552 and an AND gate 1560.

The first input buffer 1520 receives the master serial input information signal $S_{SIP}$ arriving at the SIP port of the master device 1582. The first input buffer 1520 outputs an intermediate signal $S_{SIP\_INT}$, which is fed to an input of the first delay element 1530. The intermediate signal $S_{SIP\_INT}$ is, thus, a slightly delayed version of the master serial input information signal $S_{SIP}$. The first delay element 1530 can apply a delay (tD2) that is adjustable depending on variations in process, temperature and/or power supply level. In one example, the first delay element 1530 is designed to apply a delay that compensates for the AND gate 1560 in order to provide adequate setup/hold time margins.

The second input buffer 1522 receives the master echo signal $S_{OPEQ}$ arriving at the OPEQ port of the master device 1582. The second input buffer 1522 outputs an intermediate echo signal $S_{OPEQ\_INT}$, which is fed to an input of the second delay element 1532. The intermediate echo signal $S_{OPEQ\_INT}$ is, thus, a slightly delayed version of the master echo signal $S_{OPEQ}$. The second delay element 1532 delays the intermediate echo signal $S_{OPEQ\_INT}$ in order to avoid unexpected timing glitches on a latch clock signal $S_{CLK\_LAT}$. The second delay element 1532 can apply a delay (tD1) that is adjustable depending on variations in process, temperature and/or power supply level.

The third input buffer 1524 receives the master input clock signal $S_{RCK}$ arriving at the RCK port of the master device 1582. The third input buffer 1524 outputs an intermediate clock signal $S_{CLK\_INT}$, which is fed to an input of the phase shifter 1540. The intermediate clock signal $S_{CLK\_INT}$ is, thus, a slightly delayed version of the master input clock signal $S_{RCK}$. The phase shifter 1540 provides a phase shifted clock signal $S_{CLK\_SHT}$. Thus, the shifted clock signal $S_{CLK\_SHT}$ is a phase shifted version of the master input clock signal $S_{RCK}$. By way of example, for a single-ended clock with single-data-rate operation, the phase shifter 1540 may apply a phase shift of 180 degrees (half a clock cycle), or 90 degrees (one-quarter of a clock cycle) for a single-ended clock with double-data-rate operation. This is to ensure that the center of the data eye of the input data signals (e.g., the master serial input information signal $S_{SIP}$ and the master echo signal $S_{OPEQ}$) are well aligned with the rising edge of the (shifted) intermediate clock signal $S_{CLK\_INT}$. The phase shifted clock signal $S_{CLK\_SHT}$ is fed to the clock input CK of the D-FF 1552.

The output of the first delay element 1530, ($S_{SIP\_DLY}$), is fed to a data input (D) of the first D-FF 1550, which operates to transfer the signal at its data input (i.e., a delayed intermediate signal $S_{SIP\_DLY}$ or a delayed version of the intermediate signal $S_{SIP\_INT}$) onto a data output (Q) in dependence upon the latch clock signal $S_{CLK\_LAT}$. This latch clock signal $S_{CLK\_LAT}$ is supplied by the AND gate 1560, which applies a logical AND operation on the signals present at its two inputs. The signal at one of the inputs of the AND gate 1560 is the output of the second delay element 1532, $S_{OPEQ\_DLY}$. The signal at the other one of the inputs of the AND gate 1560 is the signal at the output of the phase shifter 1540, $S_{CLK\_SHT}$. The latch clock signal $S_{CLK\_LAT}$ is fed to the clock input CK of the D-FF 1550.

Meanwhile, the output of the second delay element 1532 (i.e., a delayed echo signal $S_{OPEQ\_DLY}$ or a delayed version of the intermediate echo signal $S_{OPEQ\_INT}$) is fed to a data input (D) of the second D-FF 1552, which operates to transfer the signal $S_{OPEQ\_DLY}$ onto a data output (Q) in dependence upon the phase shifted clock signal $S_{CLK\_SHT}$. In one example, the first delay element 1530 is designed to apply approximately the same delay as the second delay element 1532, so that the signals at the data inputs of the first D-FF 1550 and the second D-FF 1552 are aligned with one another when they are latched by the respective D-FFs.

Figure 17A:
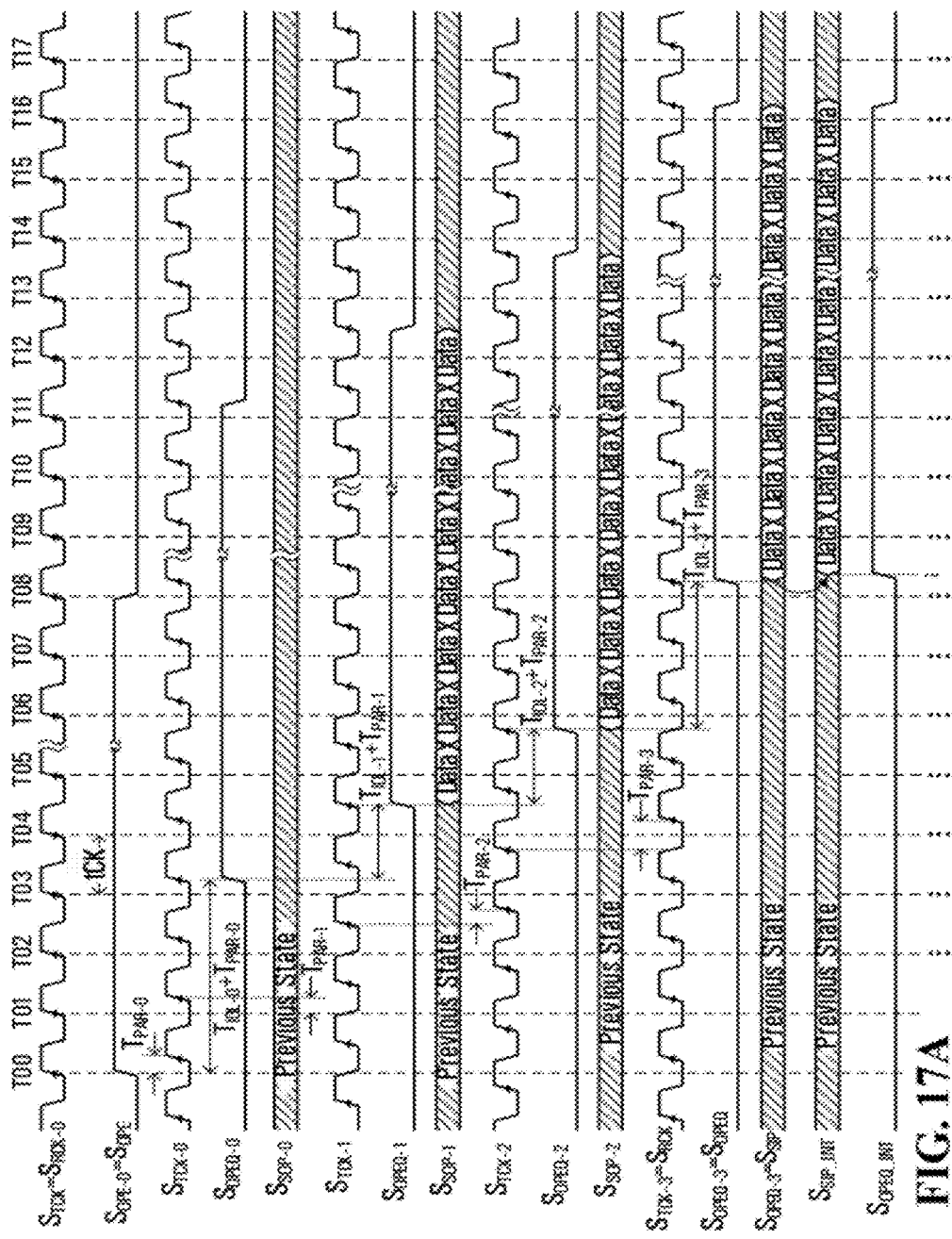
FIGS. 17A and 17B are timing diagrams illustrating the behaviour of various signals exchanged among the master device and the slave devices in the system of FIG. 15.
Figure 17B:
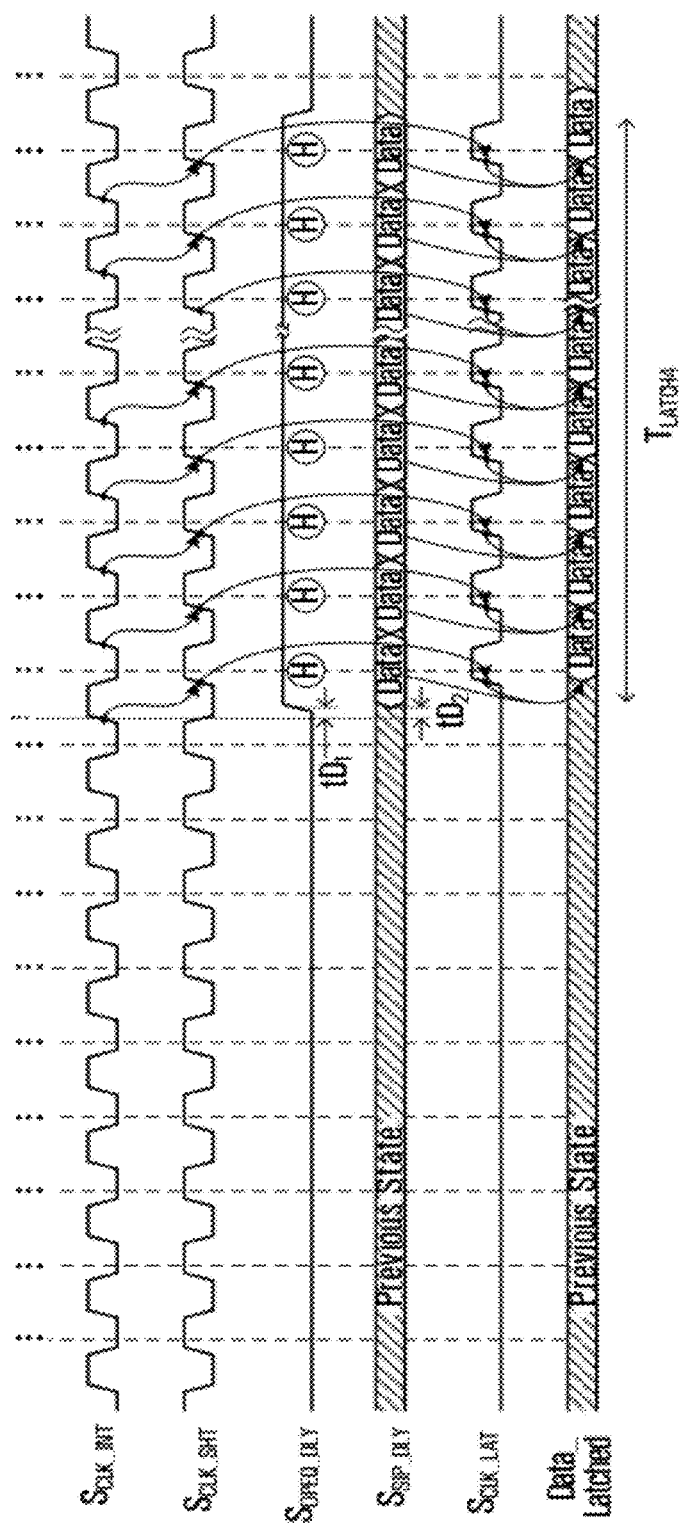

With reference to FIGS. 17A and 17B, there is shown a timing diagram that depicts the various signals in FIGS. 15 and 16, including the input clock signals $S_{RCK-0}$ (equivalent to the master output clock signal $S_{TCK}$), $S_{RCK-1}$, $S_{RCK-2}$, $S_{RCK-3}$, the output clock signals $S_{TCK-0}$, $S_{TCK-1}$, $S_{TCK-2}$, $S_{TCK-3}$ (equivalent to the master input clock signal $S_{RCK}$), the master output port enable signal $S_{OPE}$ (equivalent to the output port enable signal $S_{OPE-0}$), the echo signals $S_{OPEQ-0}$, $S_{OPEQ-1}$, $S_{OPEQ-2}$ and $S_{OPEQ-3}$ (equivalent to the master echo signal $S_{OPEQ}$), the output information signals $S_{SOP-0}$, $S_{SOP-1}$, $S_{SOP-2}$ and $S_{SOP-3}$ (equivalent to the master serial input information signal $S_{SIP}$), the intermediate signal $S_{SIP\_INT}$, the intermediate echo signal $S_{OPEQ\_INT}$, the intermediate clock signal $S_{CLK\_INT}$, the latch clock signal $S_{CLK\_LAT}$, the output of the phase shifter 1540, the output of the second delay element 1532, the output of the first delay element 1530 and the latched data at the data output of the first D-FF 1550. In this case, it is seen that the target device 1104-t is slave device 1104-1, as evidenced by the first appearance of response data on the output information signal $S_{SOP-1}$ following time T04 and in alignment with the rising edge of the output clock signal STCK-1.

The activation and deactivation of the delayed echo signal $S_{OPEQ\_DLY}$ are delayed from those of the master serial output port enable signal $S_{OPE}$. An amount of the delay includes the total flow-through latency $T_{IOL\text{-}TOTAL}$ and the total parasitic delay of $\Sigma_j T_{PAR\text{-}j}$. Also, the latch clock signal $S_{CLK\_LAT}$ is phase-shifted from the master input clock signal $S_{RCK}$. In response to the latch clock signal $S_{CLK\_LAT}$, the D-FF 1550 latches the first to last valid response data contained in the delayed intermediate signal $S_{SIP\_DLY}$ sequentially and in relevant phase during a latch period $T_{LATCH4}$, as shown in FIG. 17B. The latched data "Data_Latched", the latched echo signal $S_{OPEQ\_LAT}$ and the shifted clock signal $S_{CLK\_SHT}$ are provided to the master controller 1510 of the master device 1582.

The circuit of FIG. 16 is just an example. Any modifications and variations of the circuit of FIG. 16 to achieve the desired functionality are considered to be within the scope of the present invention and modifications are possible.

Each of the D-FF 1230, 1232, 1234, 1550 and 1552 is an example of latching circuitry. It would be apparent to those skilled in the art that there are numerous other alternatives to achieve such a latching function.

It will, therefore, be appreciated that in some embodiments of the present invention, a system is provided in which a plurality of semiconductor devices are joined to a master device in a feedforward ring type interconnection, whereby the master device pre-determines the total flow-through latency in order to result in accurate establishment of acquisition instants for capture of response data received from a target device.

It will, therefore, be appreciated that in other embodiments of the present invention, a system is provided in which a plurality of semiconductor devices are joined to a master device in a feedback ring type interconnection, whereby the master device relies on propagated signals (e.g., an output port enable signal and, in some cases, a cascaded clock signal) to accurately establish acquisition instants for capture of response data received from a target device.

Thus, systems in accordance with embodiments of the present invention can be operated at higher frequency with minimized and cost effective data receivers in memory controllers.

In the system, the format of the data transferred by the serial output information signal and the serial input information signal may be serial bit or parallel bit.

The embodiments described above are examples and it would be apparent to those of ordinary skill in the art that there would be many variants to the present invention. These variants are, for example, changes in clock rate (e.g., single data rate (SDR), double data rate (DDR), quad data rate (QDR), octal data rate (ODR), graphics double data rate (GDDR)), clock synchronization (e.g., source-synchronous, center-aligned), signal level (e.g., single-ended, differential), the number of slave devices in the serial interconnection, voltage supply levels, whether a signal is considered active when high or when low, and various other functional characteristics. There is also no limitation on the types of slave devices that may be interconnected or on the number of different types of devices connected in the same serial interconnection.

Persons skilled in the art should also appreciate that embodiments of the present invention can be used in conjunction with other innovations relating to arrangements of serially interconnected semiconductor devices. Examples of such other innovations can be found in various patent applications, a non-limiting set of which includes:

Ser. No. 60/722,368, filed Sep. 30, 2005;
Ser. No. 11/324,023, filed Dec. 30, 2005;
Ser. No. 11/496,278, filed Jul. 31, 2006;
Ser. No. 11/521,734, filed Sep. 15, 2006;
Ser. No. 11/606,407, filed Nov. 29, 2006;
Ser. No. 11/771,023 filed Jun. 29, 2007; and
Ser. No. 11/771,241 filed Jun. 29, 2007.

Moreover, where components and circuitry of the various devices of the system have been illustrated as being directly connected to one another, one should appreciate that this has been done for the sake of simplicity and that other components and circuitry may be placed therebetween or coupled thereto without detracting from the spirit of the invention. As a result, what appear to be direct connections in the drawings may in fact be implemented as indirect connections in an actual realization.

Furthermore, although the various signals traveling among slave devices, or between slave devices and the master device, have been described and illustrated as having a single bit-width, it will be within the purview of a skilled technician to modify the various components of the systems 502, 802, 1202, 1502 and their interfaces to allow for the communication of one or more signals having a multi-bit width. Also, it is within the scope of the present invention to provide multiple sets of signals each having a single bit-width. Thus, for example, where a two-bit wide clock is desired, one can implement this feature by using multiple single-bit-width clock sub-signals or by using a single clock signal that is two bits in width. For a signal requiring a greater bit width, a combination of sub-signals, each with a particular bit-width, can be used.

It would also be apparent to those of ordinary skill in the art that the operations and functions of certain ones of the above-described controllers, processors and other elements may be achieved by hardware or software.

While specific embodiments of the present invention have been described and illustrated, it will be apparent to those skilled in the art that numerous modifications and variations can be made without departing from the scope of the invention as defined in the appended claims.

What is claimed is:

1. A method for communicating with a serial interconnection including a plurality of series-connected semiconductor devices, the devices in the serial interconnection including a first device and a last device, the method comprising:
   supplying a clock signal for operation of the devices in the serial interconnection;
   sending first instruction information for identifying a target device in the serial interconnection;
   sending second instruction information for identifying an operation for the target device to perform, the target device operating in accordance with the second instruction information to provide response data, the response data appearing in an output signal from the last device of the serial interconnection;
   providing an acquisition instant in relation to the clock signal; and
   receiving the output signal from the last device to capture the response data in response to the acquisition instant.

2. The method of claim 1, further comprising:
   enabling the target device identified by the first instruction information, so that the enabled target device provides the response data.

3. The method of claim 2, wherein the step of sending second instruction information comprises:
   issuing an access command as the second instruction information destined for the target device, so that the target device performs the operation in accordance with the access command.

4. The method of claim 3, wherein:
   the step of providing comprises establishing the acquisition instant in response to the access command, the clock signal and a flow-through latency of the serial interconnection; and
   the step of receiving comprises starting the capturing of the response data in the output signal in response to the acquisition instant.

5. The method of claim 3, wherein:
   the step of supplying comprises supplying the clock signal commonly to the devices in the serial interconnection;
   the step of enabling comprises sending an enable signal that is propagated through the serial interconnection;
   the step of providing comprises establishing the acquisition instant in response to the propagated enable signal and the clock signal; and
   the step of receiving comprises capturing of the response data in the output signal in response to the acquisition instant.

6. The method of claim 3, wherein the step of issuing comprises issuing a read command as the access command and each of the devices includes a memory, further comprising:
   sending third instruction information to the serial interconnection, the third instruction information identifying a location in memory, the first, second and third instruction information being contained in a command string,
   in response to the read command as the second instruction information contained in the command string, the target device reading data from a memory location in the memory, the memory location being identified by the third instruction information, the read data being provided as the response data.

7. An apparatus for communicating with a serial interconnection including a plurality of series-connected semiconductor devices, the devices in the serial interconnection including a first device and a last device, the apparatus comprising:
a controller for providing a clock signal for operation of the devices in the serial interconnection and for sending first and second instruction information to the serial interconnection, the first instruction information identifying a target device in the serial interconnection, the second instruction information identifying an operation for the target device to perform, the target device operating in accordance with the second instruction information to provide response data, the response data appearing in an output signal from the last device; and
a receiver for receiving the output signal from the last device, the receiver comprising:
acquisition establishing circuitry for establishing an acquisition instant relating to the clock signal; and
signal latching circuitry for latching the output signal at the acquisition instant to capture the response data.

8. The apparatus of claim 7, wherein the controller is capable of sending an enable signal to enable the target device to provide the response data.

9. The apparatus of claim 8, wherein the controller is further capable of issuing an access command as the second instruction information destined for the target device, the target device performing an access operation in accordance with the access command and providing the response data.

10. The apparatus of claim 9, wherein:
the acquisition establishing circuitry comprises a clock producer for producing a latch clock signal having latch clocks in response to the clock signal from the controller, the access command and a flow-through latency of the serial interconnection; and
the signal latching circuitry comprises data latching circuitry for latching the output signal containing the response data in response to the latch clock signal to capture the response data.

11. The apparatus of claim 10, wherein:
the clock producer comprises a clock processor for processing the clock signal from the controller to produce the latch clocks with a delay from the access command, the delay being in accordance with the flow-through latency of the serial interconnection.

12. The apparatus of claim 9, wherein:
the clock signal is provided commonly to the devices in the serial interconnection; and
the enable signal is propagated through the serial interconnection,
the acquisition establishing circuitry comprises a clock producer for producing a latch clock signal having latch clocks in response to the clock signal from the controller and the propagated enable signal; and
the signal latching circuitry comprises data latching circuitry for latching the output signal containing the response data in response to the latch clock signal to capture the response data.

13. The apparatus of claim 9, wherein:
each of the devices includes a memory;
the controller is capable of:
issuing a read command as the access command; and
sending third instruction information to the serial interconnection, the third instruction information identifying a memory location in memory; and
the target device reads data from the memory location in the memory in accordance with the third instruction information in response to the read command and provides the read data as the response data.

14. An apparatus for use in processing signals received from a serial interconnection including a plurality of series-connected semiconductor devices, the devices in the serial interconnection including a first device and a last device, wherein a given device in the serial interconnection is responsive to receipt of a command destined therefor to provide response data that appears in an output signal provided from the last device, the apparatus comprising:
circuitry for establishing an acquisition instant in response to the command; and
circuitry for latching the output signal at the acquisition instant to capture the response data.

15. A method for use in processing signals received from a serial interconnection including a plurality of series-connected semiconductor devices, the devices in the serial interconnection including a first device and a last device, wherein a given device in the serial interconnection is responsive to receipt of a command destined therefor to provide response data that appears in an output signal provided from the last device, the method comprising:
establishing an acquisition instant in response to the command; and
latching the output signal in response to the acquisition instant to capture the response data.

16. A system comprising:
a serial interconnection including a plurality of series-connected semiconductor devices having a first device and a last device, each of the devices being responsive to receipt of a command destined therefor to provide response data that appears in an output signal provided from the last device;
a controller configured to effect issuance of a command to the serial interconnection, the command being destined for a target device in the serial interconnection, the target device providing response data that appears in an output signal provided from the last device; and
a receiver configured to establish an acquisition instant in response to the command and to latch the output signal in response to the acquisition instant to capture the response data.

17. The system of claim 16, wherein:
each of the devices includes a memory;
the controller is capable of sending third instruction information to the serial interconnection, the third instruction information identifying a memory location in memory; and
the target device reads data from a memory location in the memory identified by the third instruction information and provides the read data as the response data.

* * * * *